United States Patent
Matsubayashi

(10) Patent No.: US 7,646,324 B2
(45) Date of Patent: Jan. 12, 2010

(54) PIPELINE TYPE ANALOG-DIGITAL CONVERTER HAVING REDUNDANT COMPARATOR

(75) Inventor: Tomoya Matsubayashi, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 0 days.

(21) Appl. No.: 12/068,187

(22) Filed: Feb. 4, 2008

(65) Prior Publication Data

US 2008/0198055 A1 Aug. 21, 2008

(30) Foreign Application Priority Data

Feb. 20, 2007 (JP) .............................. 2007-039623

(51) Int. Cl.
*H03M 1/38* (2006.01)
(52) U.S. Cl. ...................... 341/161; 341/118; 341/120; 341/155; 341/158; 341/159
(58) Field of Classification Search ......... 341/118–120, 341/155, 158, 159, 161
See application file for complete search history.

(56) References Cited

U.S. PATENT DOCUMENTS

| | | | |
|---|---|---|---|
| 6,366,230 B1* | 4/2002 | Zhang et al. ................. | 341/162 |
| 6,600,440 B1* | 7/2003 | Sakurai ....................... | 341/172 |
| 6,611,222 B1* | 8/2003 | Murphy ...................... | 341/155 |
| 6,617,992 B2* | 9/2003 | Sakurai ....................... | 341/161 |
| 6,778,126 B2* | 8/2004 | Ali ............................. | 341/156 |
| 6,861,969 B1* | 3/2005 | Ali ............................. | 341/161 |
| 6,879,277 B1* | 4/2005 | Cai ............................. | 341/155 |
| 7,002,505 B2* | 2/2006 | Hughes ....................... | 341/161 |
| 7,009,548 B2* | 3/2006 | Chiang et al. ................ | 341/161 |
| 7,088,278 B2* | 8/2006 | Kurose et al. ................ | 341/155 |
| 7,330,145 B2* | 2/2008 | Van Der Ploeg ............ | 341/161 |
| 7,397,409 B2* | 7/2008 | Jeon et al. .................... | 341/156 |
| 2007/0176814 A1* | 8/2007 | Grace .......................... | 341/155 |

FOREIGN PATENT DOCUMENTS

JP 2005-72844 3/2005

OTHER PUBLICATIONS

P.R. Gray "A 10b Msample/s, 35 mW Pipeline A/D Converter", IEEE Journal of Solid-State Circuits, vol. 30, No. 3, Mar. 1995.
Byung-Moo "A 69-mW 10-bit 80-MSample/s Pipelined CMOS ADC", IEEE Journal of Solid-State Circuits, vol. 38, No. 12, Dec. 2003.

* cited by examiner

*Primary Examiner*—Linh V Nguyen
(74) *Attorney, Agent, or Firm*—McGinn IP Law Group, PLLC

(57) ABSTRACT

A pipeline type analog-digital converter includes a first to an N-th (N is an integer of not less than 2) stages ($10_1$ to $10_N$) brought into cascade connection and converting an analog signal input from a preceding stage to a digital signal of a predetermined bit and outputting the digital signal. Each of the first to the (N−1)-th stages ($10_1$ to $10_{N-1}$) includes an analog-digital converter circuit including comparators comparing an analog signal with reference potential being determined in advance and mutually different in parallel. The first to the (N−1)-th stages are in redundant configuration with the comparators of the stage including an auxiliary comparator.

15 Claims, 13 Drawing Sheets

Figure 6

| | THRESHOLD VALUE OF COMPARATOR WITH HIGH REFERENCE POTENTIAL (Vcomp1) | THRESHOLD VALUE OF COMPARATOR WITH LOW REFERENCE POTENTIAL (Vcomp2) | REMARKS |
|---|---|---|---|
| A | WITHIN TOLERABLE RANGE | WITHIN TOLERABLE RANGE | |
| B | WITHIN TOLERABLE RANGE | EXCEEDING NEGATIVE TOLERANCE | |
| C | WITHIN TOLERABLE RANGE | EXCEEDING POSITIVE TOLERANCE | HERE, THRESHOLD VALUES OF COMPARATORS WITH HIGH/LOW REFERENCE POTENTIAL ARE NOT REVERSED |
| D | EXCEEDING NEGATIVE TOLERANCE | WITHIN TOLERABLE RANGE | HERE, THRESHOLD VALUES OF COMPARATORS WITH HIGH/LOW REFERENCE POTENTIAL ARE NOT REVERSED |
| E | EXCEEDING POSITIVE TOLERANCE | WITHIN TOLERABLE RANGE | |
| F | EXCEEDING NEGATIVE TOLERANCE | EXCEEDING NEGATIVE TOLERANCE | |
| G | EXCEEDING POSITIVE TOLERANCE | EXCEEDING POSITIVE TOLERANCE | |
| H | WITHIN TOLERABLE RANGE | EXCEEDING POSITIVE TOLERANCE | AND THRESHOLD VALUES OF COMPARATORS WITH HIGH/LOW REFERENCE POTENTIAL ARE REVERSED |
| I | EXCEEDING NEGATIVE TOLERANCE | WITHIN TOLERABLE RANGE | AND THRESHOLD VALUES OF COMPARATORS WITH HIGH/LOW REFERENCE POTENTIAL ARE REVERSED |
| J | EXCEEDING NEGATIVE TOLERANCE | EXCEEDING POSITIVE TOLERANCE | AND THRESHOLD VALUES OF COMPARATORS WITH HIGH/LOW REFERENCE POTENTIAL ARE REVERSED |

| B1 | B0 | D1 | D0 |
|----|----|----|----|
| 0  | 0  | 0  | 0  |
| 0  | 1  | 0  | 1  |
| 1  | 1  | 1  | 0  |

| B1 | B0 | D1 | D0 |
|----|----|----|----|
| 0 | 0 | 0 | 0 |
| 0 | 1 | 0 | 1 |
| 1 | 0 | 0 | 1 |
| 1 | 1 | 1 | 0 |

YIELD FACTOR OF AD CONVERTER INFLUENCED BY YIELD FACTOR OF COMPARATOR IN 10-bit PIPELINE AD CONVERTER OF 1.5-bit RESOLUTION STAGE

| YIELD FACTOR OF COMPARATOR | | YIELD FACTOR OF AD CONVERTER (%) | | |
|---|---|---|---|---|
| $\sigma$ | % | WITHOUT REDUNDANT UNIT | WITH ONE REDUNDANT UNIT | WITH TWO REDUNDANT UNIT |
| 1.0 | 68.3 | 0.2 | 18.3 | 59.5 |
| 1.5 | 86.6 | 10.1 | 75.0 | 96.3 |
| 2.0 | 95.4 | 47.5 | 96.7 | 99.8 |
| 2.5 | 98.8 | 81.9 | 99.8 | 100.0 |
| 3.0 | 99.7 | 95.8 | 100.0 | 100.0 |
| 3.5 | 100.0 | 99.3 | 100.0 | 100.0 |
| 4.0 | 100.0 | 99.9 | 100.0 | 100.0 |

(i) IN CASE OF PRESENCE OF NO OFFSET IN COMPARATOR (ii) IN CASE OF PRESENCE OF OFFSET IN COMPARATOR

PIPELINE TYPE ANALOG-DIGITAL CONVERTER HAVING REDUNDANT COMPARATOR

BACKGROUND OF THE INVENTION

1. Field of the Invention

The present invention relates to an analog-digital converter and relates in particular to a pipeline type analog-digital converter.

2. Description of Related Art

FIG. 12 is a diagram schematically illustrating an example of a typical configuration of an analog-digital converter (hereinafter to be abbreviated as "A/D converter" or "ADC") of a pipeline type. Here, on a general configuration of a pipeline type A/D converter, description in Patent Document 1 and Non-patent Documents 1, 2 and the like, for example, is brought into reference.

With reference to FIG. 12, that pipeline type A/D converter comprises a first stage ($100_1$) to an N-th stage (200) brought into N-stage cascade connection and a digital error correction circuit 30 receiving bit data outputs respectively from the first stage ($100_1$) to the N-th stage (200), carrying out digital error correction processing and outputting a final N+1 bit digital signal.

The first stage (1001) receives an analog signal input, converts the analog input signal to 1.5 bit (=2 bit−1), outputs the converted 1.5 bit data to the digital error correction circuit 30 and outputs output voltage derived by doubling residue between the input analog signal and the voltage corresponding with the converted bit data to a stage 2 (not illustrated in the drawing) of the subsequent stage.

The second stage receives an analog signal input output from the first stage ($100_1$), converts the analog input signal to 1.5 bit (=2 bit−1) data, outputs the converted 1.5 bit data to the digital error correction circuit 30 and output voltage derived by doubling residue between the input analog signal and the voltage corresponding with the converted bit data to the second stage (not illustrated in the drawing) of the subsequent stage. Below, in the same ways, each stage undergoes A/D conversion; the N-th stage (200) of the final stage receives an analog signal from the (N−1)-th stage (100N−1), then converts the analog signal voltage to 2-bit data and outputs the 2-bit data to the digital error correction circuit 30.

The digital error correction circuit 30 receives bit data output from the first stage ($100_1$) to the N-th stage (200), sums respective bit data, carries out digital error correction processing and outputs N+1 bit digital signal.

FIG. 14 is a diagram describing a configuration of a stage of the pipeline type A/D converter illustrated in FIG. 12. The function block of the first stage ($100_1$) to the (N−1)-th stage ($100_{N-1}$) takes the same configuration.

With reference to FIG. 14, each stage of the first stage ($100_1$) to the (N−1)-th stage ($100_{N-1}$) includes a sample-hold circuit (S/H) 101, a subtraction circuit 102, an amplifier circuit 103, an A/D converter circuit (abbreviated as "ADC") 104 and a D/A converter circuit (abbreviated as "DAC") 105. In the N-th stage (200), analog signals do not have to be output to the subsequent stage and, therefore, preferably includes at least only a flash type A/D converter as illustrated in FIG. 18.

In FIG. 14, the sample-hold circuit 101 samples an analog signal Vin from the preceding stage to retain voltage thereof. The A/D converter circuit 104 converts the analog signal Vin to 1.5 bit data and outputs the converted bit data to the digital error correction circuit 30.

The D/A converter circuit 105 converts the data having undergone digital conversion to an analog signal with the A/D converter circuit 104.

The subtraction circuit 102 subtracts the analog signal output from the D/A converter circuit 105 from the input analog signal retained in the sample-hold circuit 101 and outputs the subtraction result (residue signal).

The amplifier circuit 103 causes the residue signal output from the subtraction circuit 102 to undergo voltage amplification at amplification factor of 2 and output the amplified voltage to a stage of the subsequent stage. Such a configuration enables the voltage range of the input analog signal to fall within the range of the same voltage-width (voltage range between +Vref and −Vref, for example) in each stage.

FIG. 16 is a diagram illustrating a configuration of the A/D converter circuit 104 (see FIG. 14) of each stage of the first stage ($100_1$) to the (N−1)-th stage ($100_{N-1}$). With reference to FIG. 16, the A/D converter circuit 104 is configured as a flash type A/D converter circuit comprising two comparators comparing analog signals with the respective reference potential in parallel. That is, the A/D converter circuit 104 comprises a comparator 110.1 comparing voltage of analog signals with the first reference potential and outputting B1 as a result of comparison, a comparator 110.2 comparing voltage of analog signals with the second reference potential and outputting B0 as a result of comparison and a coder 112 receiving an input of comparison results B0 and B1 from the comparators 110.1 and 110.2 to code the input to 1.5 bit data (D0 and D1). Here, in the case where the voltage range of the input analog signal, that is, the voltage range of the input analog signals to the comparator in each stage falls within the range between +Vref to −Vref, +Vref/4, for example, is selected as the first reference potential and −Vref/4, for example, and the like are selected as the second reference potential. Each stage is configured to input the analog signal obtained by causing the residue signal (balance between the output of the sample-hold circuit 101 and the output voltage of the DAC 105) to undergo voltage amplification at amplification factor of 2 to the stage of the subsequent stage. Therefore, the value of the reference potential of the comparator 110.1 is the same as the value of the reference potential of the comparator 110.2 between the respective stages.

As described above, FIG. 18 is a diagram illustrating an example of a configuration of the N-th stage (200). With reference to FIG. 18, the N-th stage (200) is configured as a flash type A/D converter circuit comprising three comparators for comparing the input analog signals in parallel. That is, the N-th stage comprises a comparator 111.1 comparing voltage of analog signals with the first reference potential and outputting B2 as a result of comparison, a comparator 111.2 comparing voltage of analog signals with the second reference potential and outputting B1 as a result of comparison, a comparator 111.3 comparing voltage of analog signals with the third reference potential and outputting B0 as a result of comparison and a coder 113 receiving inputs of comparison results B0, B1 and B2 from the first to third comparators 111.1 to 111.3 to code the input to two bit data (D0 and D1) and output the digital signals. Here, in the case where the voltage range of the input analog signal, that is, the voltage range of the input analog signals to the comparator in each stage falls within the range between +Vref to −Vref, +Vref/2, for example, is selected as the first reference potential, 0, for example, is selected as the second reference potential and −Vref/2, for example, and the like are selected as the third reference potential.

FIG. 20A illustrates residue plots in each stage. The axis of abscissae is for the analog signal Vin (see FIG. 14) input to the i stage (here, $1 \leq i \leq N-1$) and the axis of ordinates is for analog signal Vout (see FIG. 14) output from the stage. Both of Vin and Vout fall within the rage between +Vref and −Vref. FIG. 20A exemplifies residue plots in the case where there is no offset for a comparator of the i-th stage and FIG. 20B exemplifies residue plots in the case where there are offsets ΔVcomp1 and 2 in the comparators to be compared with +/−Vref/4 in voltage, respectively (see Non-patent document 1).

In the pipeline type A/D converter, digital output code of each stage is provided with redundant bit and thereby the offset tolerance of the comparator is alleviated. For example, in a pipeline type A/D converter with resolution of each stage being 1.5 bit, the case where the comparator discriminates the analog signal to be +Vref/4 and −Vref/4, the offset value of the respective comparators up to +Vref/4 and −Vref/4 is permitted since monotonicity of the A/D converter is secured (see Non-patent document 1 and the like).

FIG. 13 illustrates a general configuration of a pipeline type A/D converter as reference. With reference to FIG. 13, the first stage ($100a_1$) to (N−1)-th stage ($100a_{N-1}$) outputs digital data signal of ($B_1$+1) bit-1 to ($B_{N-1}$+1) bit-1 and the N-th stage (200a) outputs the digital data signal of $B_N$ bit. B1 to $B_{N-1}$ are respectively predetermined integers being not less than 1. Here, configuration in FIG. 12 corresponds to the case of $B_1$ to $B_{N-1}$ being 1 and $B_N$ being 2 in FIG. 13. FIG. 15 is a diagram illustrating a configuration of the first stage ($100a_1$) to the (N−1)-th stage ($100a_{N-1}$). In the first ($100a_1$) to the (N−1)-th stage ($100a_{N-1}$), an ADC circuit 104a outputs a digital signal of (B+1) bit-1 and the voltage amplification factor of the amplifier circuit 103a is set to $2^B$. FIG. 17 is a diagram illustrating a configuration of the ADC circuit 104 in FIG. 15. With reference to FIG. 17, the ADC circuit 104a is configured by comprising ($2^{B+1}$−2) units of comparators 100a.1 to 110a.3 in parallel. A coder 112a receiving inputs of the outputs of the comparators 110a.1 to 110a.3 outputs a digital output of (B+1) bit-1. FIG. 19 is a diagram illustrating a configuration of the N-th stage (200a) in FIG. 13. With reference to FIG. 19, the N-th stage (200a) is configured by comprising ($2^B$−1) units of comparators 111a.1 to 111a.3 in parallel. A coder 113a receiving inputs of the outputs of the comparators 111a.1 to 111a.3 outputs a B bit (B=$B_N$ in the case of FIG. 13) output.

[Patent Document 1] Japanese Patent Application Laid-Open No. 2005-72844

[Non-Patent Document 1] P. R. Gray "A 10 b 20 Msample/s, 35 mW Pipeline A/D Converter", IEEE JOURNAL OF SOLID-STATE CIRCUITS, Vol. 30, No. 3, 1995/March

[Non-Patent Document 2] Byung-Moo "A 69-mW 10-bit 80-MSample/s Pipelined CMOS ADC", IEEE JOURNAL OF SOLID-STATE CIRCUITS, Vol. 38, No. 12, 2003/December The above described conventional pipeline type A/D converter has problems described below.

(A) Since one comparator influences a wide range of digital output code, in the case where the offset value of the comparator occasionally exceeds the tolerance, the comparator will no longer fulfill required properties as an A/D comparator dramatically.

(B) In the case where the comparator causes an error, the comparator cannot correct the error.

(C) in the case where decrease in the voltage range of the analog signal input to the A/D converter due to drop of the power supply voltage and establishment of multi-bit pipeline stage and the like reduce allowance offset value (offset margin) of the comparator, it becomes difficult to realize a comparator circuit required to secure a required yield factor. Due to decrease in allowance offset value of the comparator, the yield factor of the comparator decreases (occurrence frequency of the offset error in the comparator increases) and the yield factor of the A/D converter decreases.

(D) In the case of shortening the gate length of an MOS transistor for reducing circuit area and speeding up the comparator, the offset value is apt to increase to hardly enable realization of a comparator circuit required for securing a required yield factor.

Due to principles of pipeline type A/D converters, the offset value of a comparator cannot exceed the tolerance. The comparator is configured with a latch circuit to become a positive feedback circuit and is therefore highly sensitive to dispersion in manufacturing such as manufacturing process, shape and the like. Dispersion in manufacturing tends to increase as size reduction progresses. In addition, reduction in circuit area is pondered to enlarge influence of dispersion in manufacturing due to generally called Pelgrom's rule.

Therefore, in the case where a offset canceling technique with capacitance and a offset reducing technique with preamplifier cannot be utilized for application requiring a comparator with low area and low power consumption, it becomes necessary to design a comparator with a yield factor of not less than 3σ. Therefore, circuit designing becomes difficult and realization of accuracy, stability and reliability of operation property of a pipeline type A/D converter becomes difficult.

SUMMARY OF THE INVENTION

The present invention provides a pipeline type analog-digital converter comprising a plurality of stages brought into cascade connection and respectively converting an analog signal input from a preceding stage to a digital signal of a predetermined bit and outputting the digital signal, wherein at least one of the stages is in redundant configuration comprising an auxiliary comparator on at least one of a plurality of comparators comparing the analog signal in parallel.

Further in detail, the pipeline type A/D converter related to one aspect of the present invention comprises a first to an N-th (here, N is an integer of not less than 2) stages brought into cascade connection and respectively converting an analog signal input from a preceding stage to a digital signal of a predetermined bit and outputting the digital signal; each of the first to the (N−1)-th stages comprises an analog-digital converter circuit including a first to an M-th (here M being an integer of not less than 2 and the minimum number thereof being determined by a predetermined bit number of the stage) comparators comparing an analog signal with a first to an M-th reference potential being determined in advance and mutually different in parallel; at least one stage of the first to the (N−1)-th stages being in redundant configuration with at least one of the first to the M-th comparators of the stage comprising an auxiliary comparator and comprises a comparator selection circuit outputting a comparator selection signal activating one of the comparators in redundant configuration selectively.

The present invention can alleviate influence of a yield factor of a comparator to a yield factor of an A/D converter. A reason thereof is that, in the present invention, a comparator configuring a flash ADC of the stage is in a redundant configuration on at least one stage of from a first stage to an (N−1)-th stage of a pipeline type A/D converter comprising N stages, and a comparator with abnormal offset is configured to be replaced by another comparator. In addition, according to the present invention, the yield factor of the A/D converter is improved and improvement in accuracy, stability and reliability of operation property is enabled.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 6 is a diagram illustrating combination of comparator determination points of an embodiment of the present invention;

DETAILED DESCRIPTION OF THE EXEMPLARY EMBODIMENT

Figure 1:
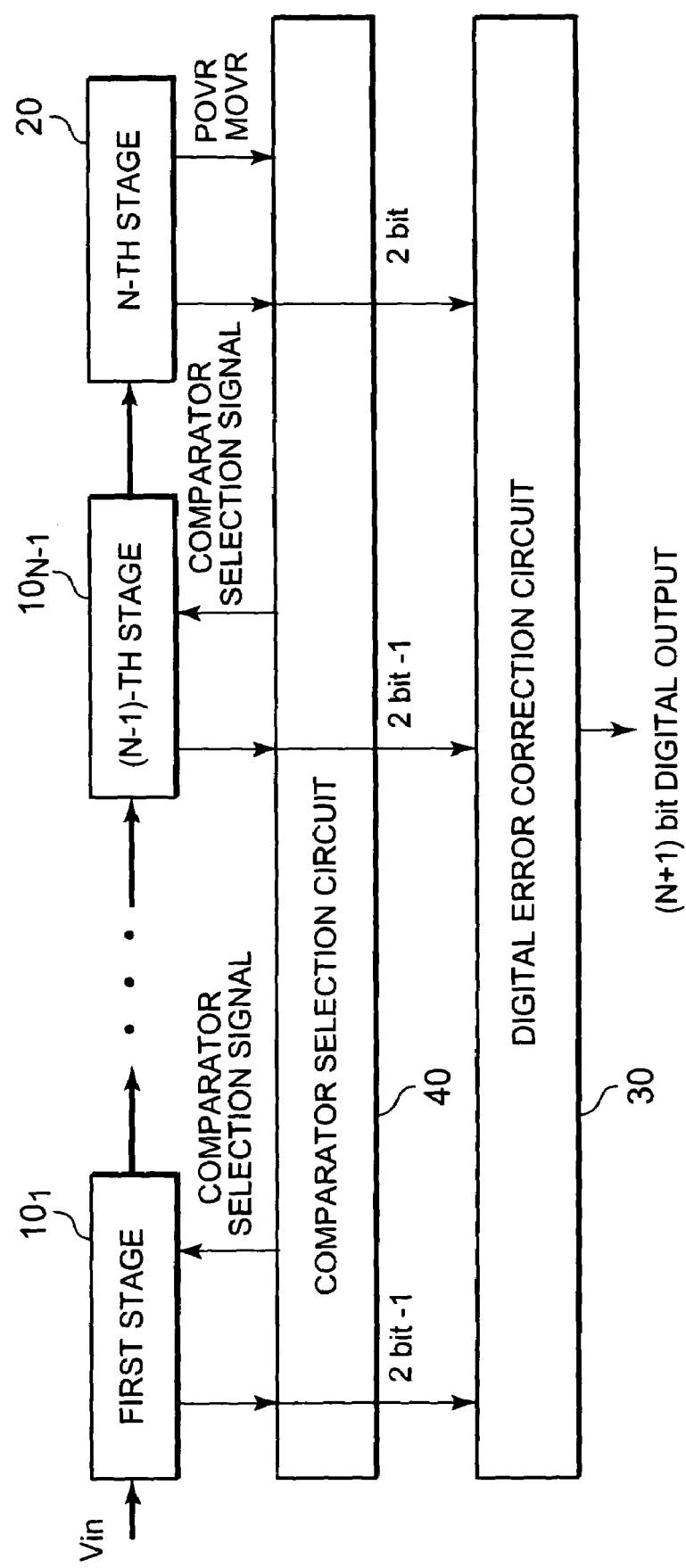
FIG. 1 is a diagram illustrating an entire configuration of an embodiment of the present invention.

A pipeline type analog-digital converter related to the present invention comprises a first to an N-th (here, N being an integer not less than 2) stages ($10_1$ to $10_{N-1}$ and 20) brought into cascade connection and respectively converting an analog signal input from a preceding stage to a digital signal of a predetermined bit; and each of the first to the (N−1)-th stages comprises an analog-digital converter circuit including a first to an M-th (here M being an integer of not less than 2 and the minimum number thereof being determined by a predetermined bit number of the stage) comparators comparing an analog signal with a first to an M-th reference potential being determined in advance and mutually different in parallel; at least one stage of the first to the (N−1)-th stages is in redundant configuration with at least one of the first to the M-th comparators of the stage comprising an auxiliary comparator; and comprises a comparator selection circuit (40) outputting a comparator selection signal activating one of the comparators in redundant configuration selectively. In the case where the comparator in redundant configuration is determined to be a comparator with an offset exceeding a tolerance, the comparator with the offset exceeding the tolerance is replaced by an auxiliary comparator based on the comparator selection signal.

Reduction in element area required for reduction in size of processing and improvement in circuit performance will cause increase in an offset of a comparator. On the other hand, input voltage range of the A/D converter will become narrow due to establishment of low voltage of a circuit and the like. In the case of enhancing resolution of the A/D converter, the offset tolerance of the comparator decreases. Under a condition where offset margins thereof become small, it is difficult to realize a comparator to give a required yield factor with low area and low consumption power. However, in the present invention, the margin required to the comparators is alleviated by making the comparators in redundant configuration. Therefore, element size advantageous for improving circuit performance being difficult to select from the point of view of a yield factor can be selected.

In the present invention, a comparator of a flash type A/D converter of each stage of a pipeline type A/D converter is in redundant configuration and in the case where a comparator of a stage in or previous to second stage from the last stage (N-th stage) reaches an offset value exceeding a tolerance (offset error), the comparator with the relevant offset errors is replaced by an auxiliary comparator. That is, in the case where a comparator with an offset value exceeding a tolerance is present, a control signal for activating the corresponding auxiliary comparator is output and a control signal for stopping operations of the comparator with an offset value exceeding a tolerance is output. Whether or not a comparator has an offset value exceeding a tolerance is detected with digital signal processing by utilizing bit data output from each stage.

In the following embodiment, examples with resolution of the first stage to the (N−1)-th stage among N stages of a pipeline type A/D converter being 1.5 bits and with resolution of the N-th stage being 2 bits will be described in detail and, thereafter, as another embodiment, an example of detection processing on the offset error in the pipeline type A/D converter with resolution of the first stage to the (N−1)-th stage being 2.5 bits and with resolution of the N-th stage being 3 bits will be described.

Embodiments

Figure 2:
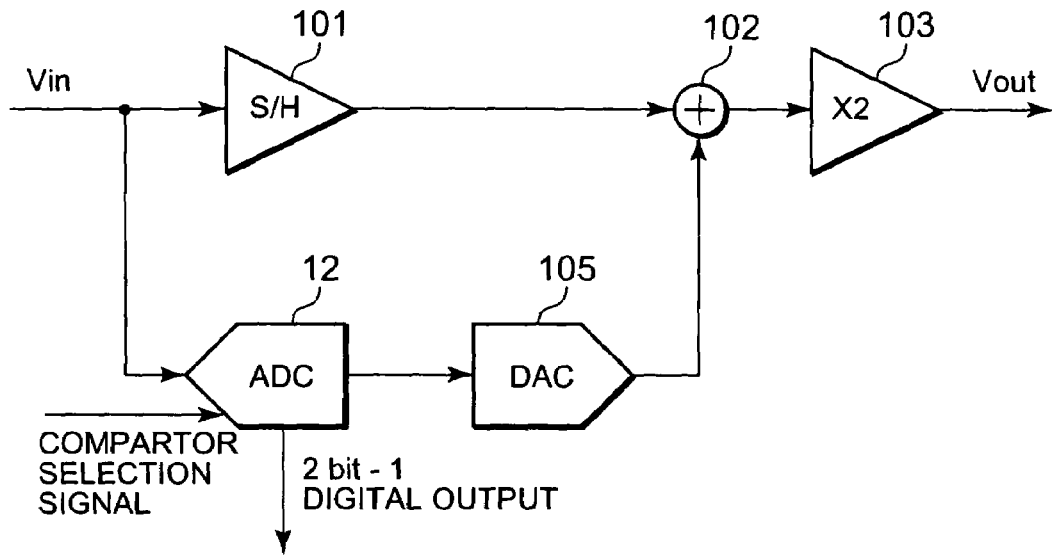
FIG. 2 is a diagram illustrating an example of the configuration of the first stage to the (N−1)-th stage of an embodiment of the present invention.
Figure 5:
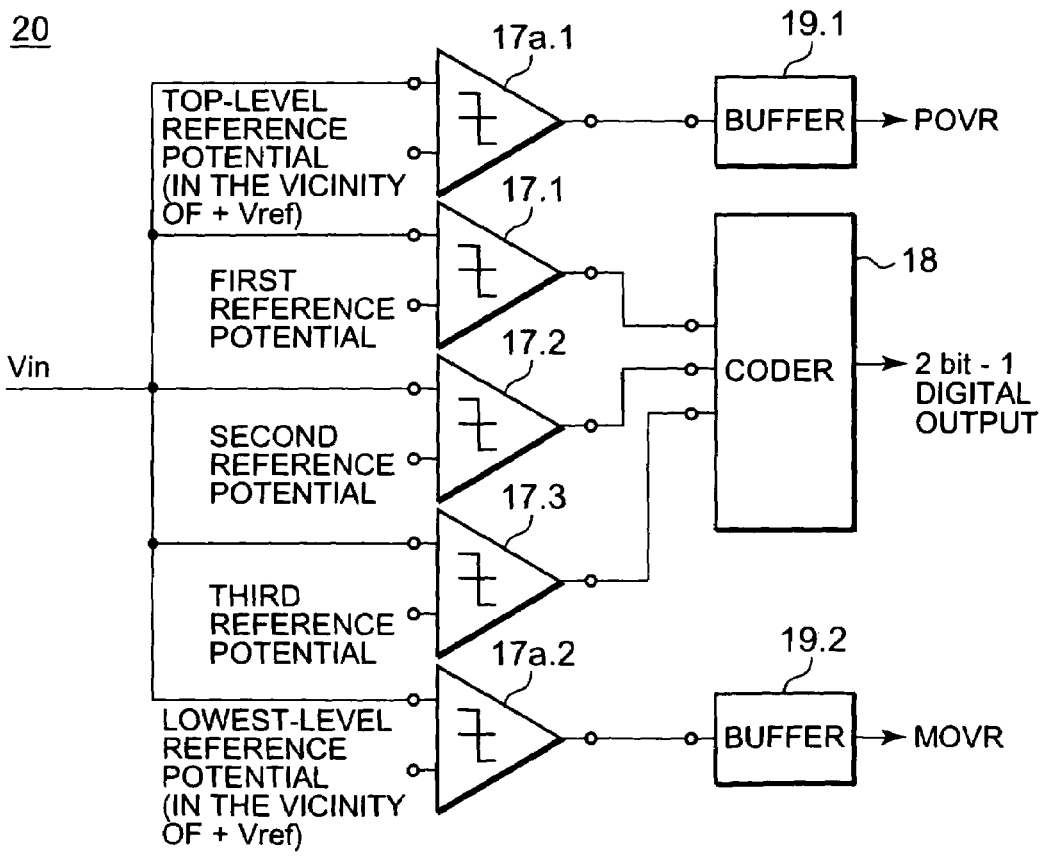
FIG. 5 is a diagram illustrating a configuration of an N-th stage of an embodiment of the present invention.

FIG. 1 is a diagram illustrating a configuration of an embodiment of the present invention. FIG. 2 is a diagram functionally describing the configuration of the first stage ($10_1$) to the (N−1)-th stage ($10_{N-1}$) in FIG. 1. FIG. 5 is a diagram functionally describing the configuration of the N-th stage (20) in FIG. 1.

With reference to FIG. 1, the pipeline type A/D converter of the present embodiment comprises the first stage ($10_1$) to the N-th stage (20); a digital error correction circuit 30 receiving bit data output respectively from the first stage ($10_1$) to the N-th stage (20), carrying out digital error correction processing and outputting a final N+1 bit digital signal; and a comparator selection circuit 40 outputting a comparator selection signal for selecting a comparator for each stage.

With reference to FIG. 2, each stage of the first stage ($10_1$) to the (N−1)-th stage ($10_{N-1}$) comprises a sample-hold circuit (101), a subtraction circuit (102), an ADC (analog-digital conversion) circuit (12), a DAC (digital-analog converter) circuit (105) and an amplifier circuit (103).

In the present embodiment, the ADC (analog-digital conversion) circuits (12) (see FIG. 2) respectively included in the first stage ($10_1$) to the (N−1)-th stage ($10_{N-1}$) includes comparators in redundant configuration and the comparator selection circuit 40 selects a comparator to be used.

In the pipeline type A/D converter of the present embodiment, the first stage ($10_1$) to the (N−1)-th stage ($10_{N-1}$) output 1.5-bit (three-valued) data to the digital error correction circuit 30. The N-th stage (20) converts an analog signal received from its preceding stage to 2-bit data and outputs the data to the digital error correction circuit 30.

The digital error correction circuit 30 receives bit data output from each stage; adds each data; carries out digital error processing; and outputs a digital signal of (N+1) bits.

The comparator selection circuit 40 receives inputs of bit data output from the first stage ($10_1$) to the N-th stage (20) to the digital error correction circuit 30 and control signal (POVR and MOVR) to be described later and outputs comparator selection signal to the first stage ($10_1$) to the (N−1)-th stage ($10_{N-1}$). The first stage ($10_1$) to the (N−1)-th stage ($10_{N-1}$) receive the comparator selection signals from the comparator selection circuit 40, activate the comparators selected from the comparators in redundant configuration with the comparator selection signal and inactivates (stops operations) the not selected comparators.

Pipeline operations of analog-digital conversion in the pipeline type A/D converter of the present embodiment will be described. The first stage ($10_1$) receives an input analog signal, which is converted to 1.5 bit data by the ADC circuit (12) (see FIG. 2); outputs the converted bit data to the error correction circuit 30 and the DAC (digital-analog conversion) circuit (105) (see FIG. 2); and, based on the bit data, outputs the voltage derived by doubling residue between the analog voltage corresponding with the bit data generated by the DAC circuit (105) and the voltage generated by the sample-hold circuit (101) (see FIG. 2) on receiving the analog input signal input to the first stage ($10_1$) to a stage 2 (not illustrated in the drawing) as an output analog signal (Vout1).

The stage 2 receives the analog signal Vout1 from the first stage ($10_1$) being the preceding stage; compares the analog voltage with two levels (+Vref/4, −Vref/4) with the ADC circuit (12) inside the stage 2 with the comparator in parallel and converts the signal to 1.5 bit data; and outputs the converted bit data to the digital error correction circuit 30 and the DAC circuit (105) (see FIG. 2). Based on the bit data, the stage 2 outputs the voltage derived by doubling residue between the analog voltage corresponding with the bit data generated by the DAC circuit (105) (see FIG. 2) and the voltage generated by the sample-hold circuit (101) (see FIG. 2) on receiving the analog signal Vout1 to a subsequent stage as an output analog signal Vout2.

Below, in the same way, each stage undergoes A/D conversion; the N-th stage (20) being the final stage receives an analog signal VoutN−1 from the (N−1)-th stage ($10_{N-1}$); compares the analog voltage with three levels with the comparator in parallel; then, converts the analog voltage to 2-bit data and outputs the 2-bit data to the error correction circuit 30 and moreover, outputs control signals POVR and MOVR (the signals POVR and MOVR being described later).

And based on bit data output from each stage, the digital error correction circuit 30 sums respective bit data, carries out digital error correction processing and finally outputs N+1 bit digital signal.

In the present embodiment, 1.5 bit data and 2 bit data supplied from each stage to the digital error correction circuit 30 are supplied to the comparator selection circuit 40 as well and the signals POVR and MOVR from the N-th stage (20) are supplied to the comparator selection circuit 40 and are used for selecting a comparator.

In the present embodiment, if the comparator selection circuit 40 realizes a function of outputting the comparator selection signal to each stage based on the bit data supplied from each stage to the digital error correction circuit 30, an arbitrary configuration is adopted. The comparator selection circuit 40 can detect a comparator with an offset error based on bit data supplied from each stage to the digital error correction circuit 30 only at the test time of detecting an offset error (with the offset exceeding a tolerance) of the comparator within each stage. In that case, at the time of normal operation, the comparator selection circuit 40 detects no offset error of the comparator inside each stage but retains the value of the comparator selection signal determined in the preceding test until the subsequent test. That is, the configuration can cause a test control signal controlling a test mode of an offset error (not illustrated in the drawing) to be supplied to the comparator selection circuit 40 and the value of the comparator selection signal determined at the time of testing to be retained until the test control signal (not illustrated in the drawing) is activated next.

Here, in FIG. 1, only in order to make the signal wiring more visible, such a configuration with the comparator selection circuit 40 being arranged between the first stage ($10_1$) to the N-th stage (20) and the digital error correction circuit 30 was exemplified. The comparator selection circuit 40 can be arranged anywhere if the configuration is designed to receive bit data supplied from the first stage ($10_1$) to the N-th stage (20) to the digital error correction circuit 30 and the control signal. For example, it goes without saying that the comparator selection circuit 40 can be arranged in the subsequent stage of the digital error correction circuit 30. In addition, it goes without saying that the bit data of each stage once received by the digital error correction circuit 30 can be transferred from the digital error correction circuit 30 to the comparator selection circuit 40. The comparator selection circuit 40 can be configured to be provided inside a BIST (Built In Self Test) circuit not illustrated in the drawing. Otherwise, the configuration can be designed so that, at the time of testing, the bit data supplied from the first stage ($10_1$) to the N-th stage (20) to the digital error correction circuit 30 and the control signal are supplied to a controller or a tester and the like not illustrated in the drawing outside the pipeline type A/D converter, a comparator of a stage corresponding to an offset error is detected with a controller or a tester and the like not illustrated in the drawing; the detection result is received; and the comparator selection circuit 40 changes the comparator selection signal to the stage to switch the comparator to an auxiliary comparator. Otherwise, it goes without saying that the comparator selection circuit 40 and the digital error correction circuit 30 can be configured as an integrated one circuit block.

Figure 3:
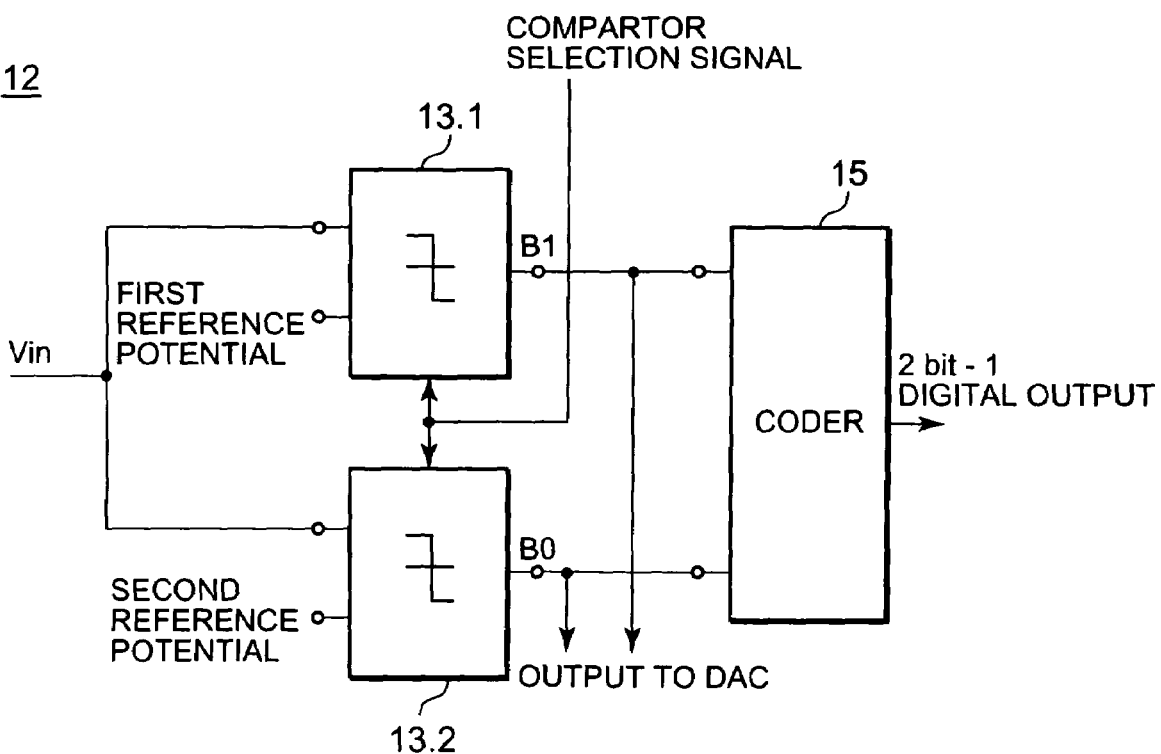
FIG. 3 is a diagram illustrating an example of the configuration of an ADC circuit of an embodiment of the present invention.

FIG. 3 is a block diagram functionally describing a configuration of an ADC circuit (12) of the first stage ($10_1$) to the (N−1)-th stage ($10_{N−1}$) the configuration of which is illustrated in FIG. 2. Circuits of the first stage ($10_1$) to the (N−1)-th stage ($10_{N−1}$) are all in the same configuration. In the N-th stage (20), 1.5-bit output data illustrated in FIG. 1 will be 2-bit output data. With reference to FIG. 3, an ADC circuit (12) comprises: a comparator circuit 13.1 in redundant configuration comparing the first reference potential with the analog signal and outputting a comparison result B1; a comparator circuit 13.2 in redundant configuration comparing the second reference potential with the analog signal and outputting a comparison result B0; and a coder 15 receiving the output B1 of the comparator circuit 13.1 and the output B0 of the comparator circuit 13.2 and outputting the coded 1.5 bit data (D1, D0). Here, the voltage range for the pipeline type A/D converter of the present embodiment to carry out analog-digital conversion falls within the range of +Vref to −Vref and the +Vref/4 and the −Vref/4 are selected as a first reference potential and a second reference potential respectively. The comparator circuit 13.1 is a comparator circuit with high reference potential and the comparator circuit 13.2 is a comparator circuit with low reference potential. In addition, the ADC circuit (12) outputs the bit data obtained by converting the input analog signal to the DAC circuit (105); based on the bit data, the DAC circuit (105) subtracts an analog voltage generated to correspond with the bit data from an analog voltage generated by a sample-hold circuit (101); amplifies the voltage of the subtracted value with a predetermined amplification factor (2, for example) to output an analog signal.

Figure 4:
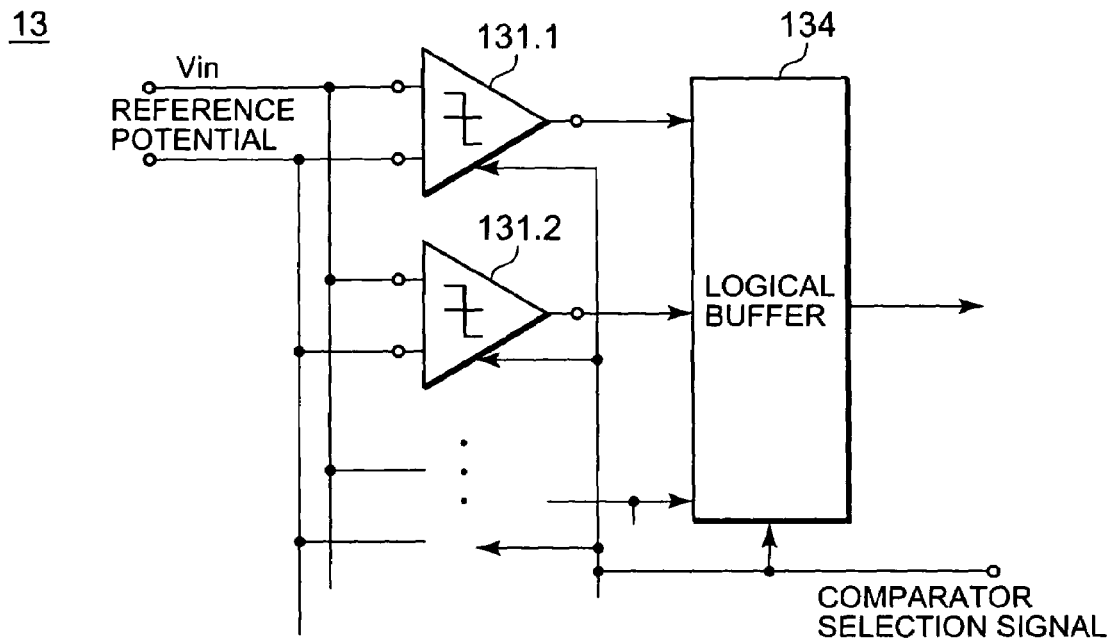
FIG. 4 is a diagram illustrating an example of the configuration of a comparator of an embodiment of the present invention.

FIG. 4 is a diagram illustrating a configuration of a comparator circuit 13.2 with low reference potential and a comparator circuit 13.1 with high reference potential in FIG. 3. With reference to FIG. 4, each comparator circuit is in redundant configuration and comprises two comparators 131.1 and 131.2 comparing analog signal in parallel and a logical buffer 134. Of course, the number of the comparators in redundant configuration can be not less than 2. The comparator selection signal activates any one of the comparators 131.1 and 131.2 and inactivates the remaining comparator. There is no restriction in particular but the comparator selection signal is a 2 bit parallel signal and each bit controls enable (activation) and disable (inactivation) of the two comparators 131.1 and 131.2. The comparator selection signal can be transferred serially and converted into 2 bits in parallel at the comparator circuit side and then supplied to the two comparators 131.1 and 131.2. The comparator selection signal from the comparator selection circuit 40 (FIG. 1) is individually supplied to the comparator circuit 13.2 (see FIG. 3) with low reference potential and the comparator circuit 13.1 (see FIG. 3) with high reference potential. In addition, the comparator selection signal is supplied individually to each of the first stage to the (N−1)-th stage.

For the comparator circuit 13.1 with high reference potential in FIG. 3, the reference potential for comparison and determination is +Vref/4 and for the comparator circuit 13.2 with low reference potential, the reference potential for comparison and determination is −Vref/4 (+Vref to −Vref being the range of the input signal voltage of the A/D converter). Accordingly, the reference potential in FIG. 4 will be +Vref/4 or −Vref/4 depending on the reference potential of the comparator circuit being high or low. Here, also in the first stage to the (N−1)-th stage, the reference potential of comparator circuit 13.1 with high reference potential is commonly set to +Vref/4 and the reference potential of comparator circuit 13.2 with low reference potential is commonly set to −Vref/4.

With reference to FIG. 5, the N-th stage (20) in FIG. 1 receives an output Vin of the (N−1)-th stage ($10_{N−1}$) with three comparators 17.1 to 17.3 in parallel. A coder 18 receives and encodes the outputs of the three comparators 17.1 to 17.3 to generate 2-bit (D0, D1). As the reference potential of comparator circuits 17.1 to 17.3 receiving inputs of analog signals from the (N−1)-th stage ($10_{N−1}$) in parallel, +Vref/2, 0 and −Vref/2 can be selected respectively. The comparator 17a.1 compares an analog signal voltage from the (N−1)-th stage with a voltage close to +Vref. When the logic 1 is determined by the comparator 17a.1, the POVR reaches a level of the logic 1 so that the buffer 19.1 outputs a binary logic signal POVR in an activated state (high level). Moreover, the comparator 17a.2 compares an analog signal voltage from the (N−1)-th stage with −Vref. When the logic 0 is determined by the comparator 17a.2, the MOVR reaches a level of the logic 0 so that the buffer 19.2 outputs a binary logic signal MOVR in an activated state (high level). Thus, the comparator of the (N−1)-th stage with 2-bit resolution determines level of the signal with −(½)Vref, 0 and +(½)Vref, and in the vicinity of −Vref and in the vicinity of +Vref. For the N-th stage (20), as the comparators 17a.1 and 17a.2 respectively determining the levels of signals in the vicinity of +Vref and in the vicinity of −Vref, comparators smaller than the other comparators 17.1 to 17.3 in offset are preferably used. The comparators 17a.1 and 17a.2 get inactivated at the time of normal operations. The offset is small and the difficulty level is comparatively not so high since a configuration different from the other comparators in the pipeline type A/D converter of the present embodiment can be selected and the like.

Figures 9A, 9B:
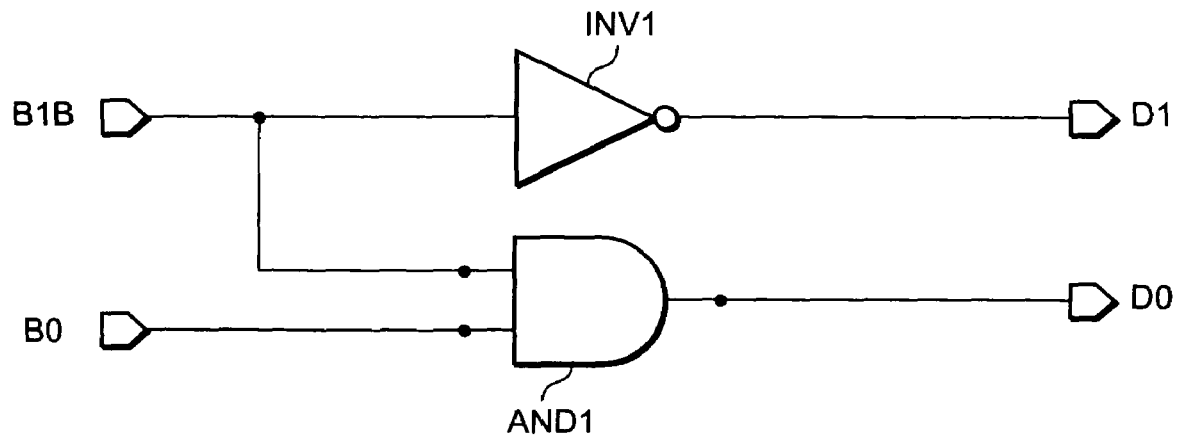
FIGS. 9A and 9B are diagrams illustrating a configuration example of a coder and a decoder of an embodiment of the present invention.

An example of a configuration of the coder 15 in FIG. 3 is illustrated in FIG. 9A and FIG. 9B. FIG. 9A is a truth table of the coder 15 in FIG. 3 and FIG. 9B is a logical configuration diagram thereof. In the case of the 2-bit output (B1, B0) of the comparator circuits 13.1 and 13.2 being (0, 0), the analog signal voltage is lower than any of +Vref/4 and −Vref/4. The output (D1, D0) of the coder 15 becomes (0, 0). In the case of (B1, B0)=(0, 1), the analog signal voltage is lower than +Vref/4 and higher than −Vref/4. The output (D1, D0) of the coder 15 becomes (0, 1). In the case of (B1, B0)=(1, 1), the analog signal voltage is higher than +Vref/4 and higher than −Vref/4. The output (D1, D0) of the coder 15 becomes (1, 0). The coder 15 is configured by an AND circuit AND1 receiving an input of B0 and a complementary signal B1B of B1 and outputting D0 and an inverter INV1 receiving an input of B1B and outputting D1.

Figures 10A, 10B:
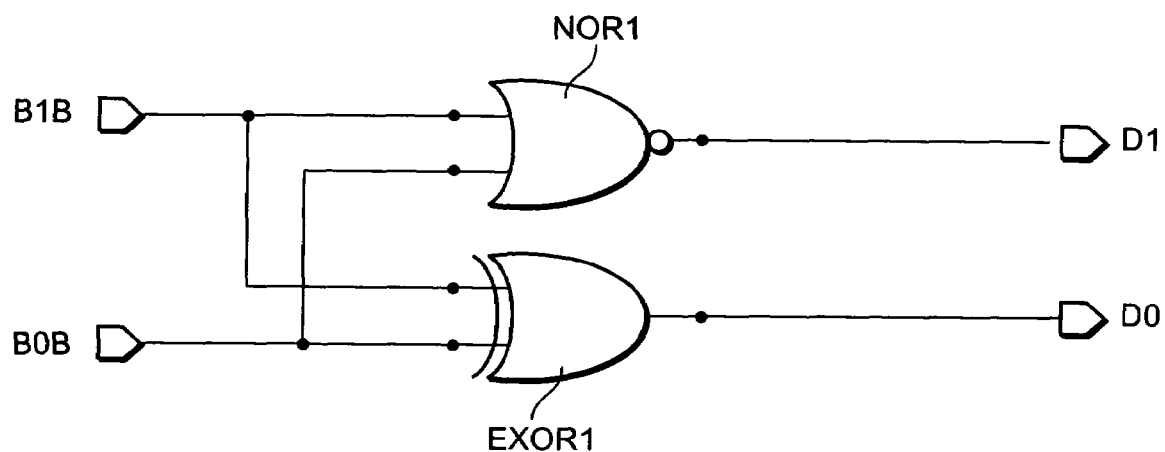
FIGS. 10A and 10B are diagrams illustrating another configuration example of a coder and a decoder of an embodiment of the present invention.

A truth table and a logical configuration diagram of another example on the configuration of the coder 15 in FIG. 3 are illustrated in FIG. 10A and FIG. 10B. (1, 0) being added to combination of an output (B1, B0) of a comparator, the coder in FIG. 10A and FIG. 10B outputs an output code (D1, D0) being the same as (B1, B0)=(0, 1) for (B1, B0)=(1, 0). The coder 15 is configured by an NOR circuit NOR1 and an exclusive OR circuit EXOR1 receiving an input of a complementary signal B0B of B0 and a complementary signal B1B of B1.

Below, in the present embodiment, an example of a technique detecting a comparator with an offset value exceeding a tolerance will be described.

(1) In the case where an output of (D1, D0) of the coder of a stage among stages (the first stage to the (N−1)-th stage) in or previous to second stage from the last is (0, 0) (the output (B1, B0) of the comparator being (0,0) and the analog signal voltage being smaller than −Vref/4); the outputs D1 of the coder of all the stages after the relevant stage are 1 (the analog signal voltage being larger than +Vref/4); and the POVR signal from the N-th stage is in an activated state (the analog signal undergoing comparison by the comparator being not less than around +Vref), selection of the comparator in the comparator circuit with low reference potential of the relevant stage is changed. That is, in that case, an offset of the currently selected comparator in the comparator circuit with low reference potential of the stage exceeds tolerance.

(2) In the case where an output of (D1, D0) of the coder of a stage among stages (the first stage to the (N−1)-th stage) in or previous to second stage from the last is (0, 1) (the analog signal voltage falling between −Vref/4 and +Vref/4); the outputs D1 of the coder of all the stages after the relevant stage are 1 (the analog signal voltage being larger than +Vref/4); and the POVR signal from the N-th stage is in an activated state, selection of the comparator in the comparator circuit with high reference potential of the stage is changed. That is, in that case, an offset of the currently selected comparator in the comparator circuit with high reference potential of the stage exceeds tolerance.

(3) At an occasion where an output of (D1, D0) of the coder of a stage among stages (the first stage to the (N−1)-th stage) in or previous to second stage from the last is (0, 1) (the analog signal voltage falling between −Vref/4 and +Vref/4); the outputs (D1, D0) of the coder of all the stages after the relevant stage are (0, 0) (the analog signal voltage being smaller than −Vref/4); and the MOVR signal from the N-th stage is in an activated state (the analog signal undergoing comparison by the comparator being not more than around −Vref), selection of the comparator in the comparator circuit with low reference potential of the stage is changed.

(4) At an occasion where a digital output (D1, D0) of a stage among stages (the first stage to the (N−1)-th stage) in or previous to second stage from the last is (1, 0) (the analog signal voltage being larger than +Vref/4); the outputs (D1, D0) of all the stages after the relevant stage are (0, 0) (the analog signal voltage being smaller than −Vref/4); and the MOVR signal from the N-th stage is in an activated state, selection of the comparator in the comparator circuit with high reference potential of the stage is changed.

Figure 20A:
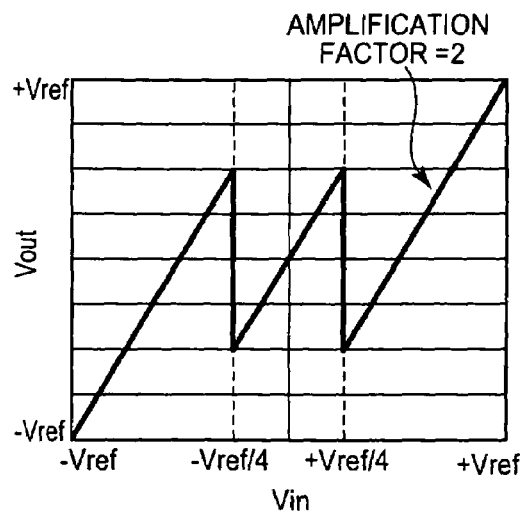
FIGS. 20A and 20B are diagrams plotting residues of a pipeline type A/D converter of a related art.
Figure 20B:
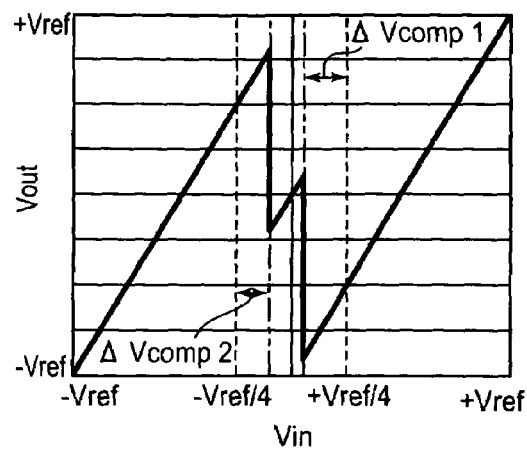

FIG. 6, FIG. 7, and FIG. 8 are diagrams for describing the present invention. FIG. 6 is a list of combination of threshold values of comparators and offset tolerance of comparators. Items A to J in FIG. 6 respectively correspond with FIGS. 7A to 7D and FIG. 8E to 8J. In FIGS. 7A to 7D and FIGS. 8E to 8J, the axis of abscissae represents inputs to an i-th stage (here, $1 \leq i \leq N-1$), that is, inputs to the sample-hold and analog-digital circuits of the i-th stage. On the other hand, the axis of ordinates represents outputs of the i-th stage, that is, outputs of an amplifier of the i-th stage and corresponds with residue plots in FIG. 20. Here, the graphs are divided into FIG. 7 and FIG. 8 only for the convenience of creating the drawings.

Figure 7A:
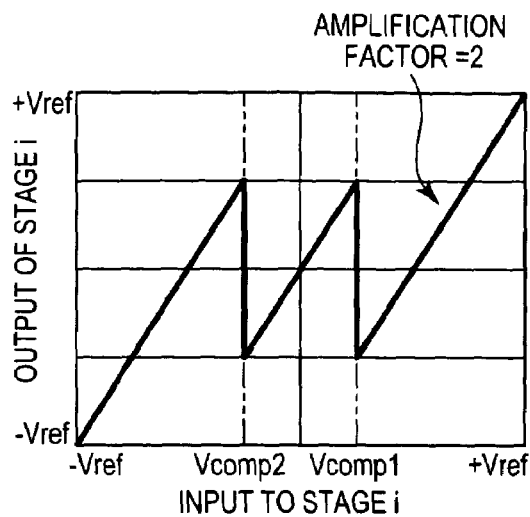
FIG. 7A-7D are diagrams describing combinations of comparator determination points of an embodiment of the present invention.

FIG. 7A shows the case where both of a threshold value (Vcomp1) of a comparator circuit (reference numeral 13.1 in FIG. 3) with high reference potential and a threshold value (Vcomp2) of a comparator circuit (reference numeral 13.2 in FIG. 3) with low reference potential fall within a tolerable range and selection of comparators does not have to be changed. With a yield factor of a comparator being not less than 2σ, probability of combination in FIG. 7A occupies not less than around 91.1%. Here 91.1% is a square of 2σ.

Figure 8E:
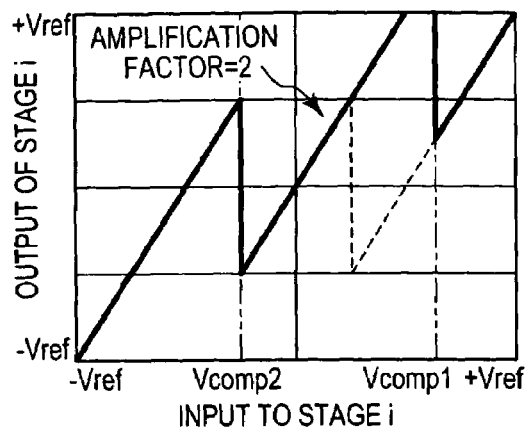
FIG. 8E-8J are diagrams describing combinations of comparator determination points of an embodiment of the present invention.
Figure 8F:
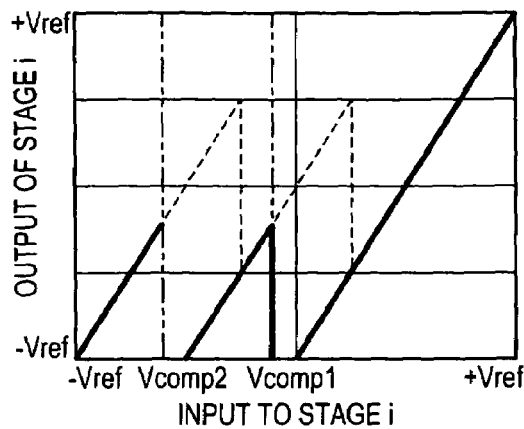
Figure 8G:
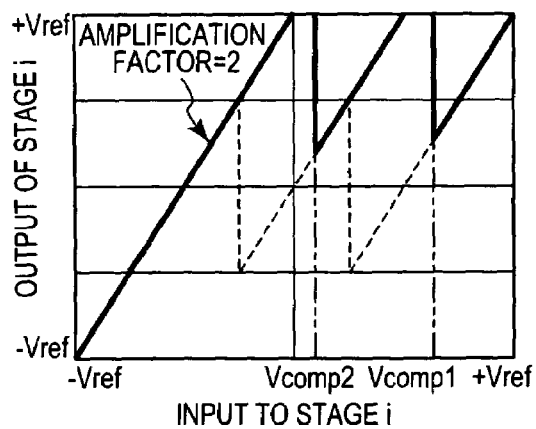
Figure 8H:
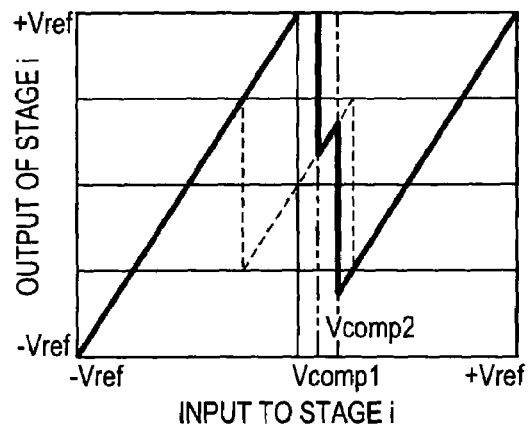
Figure 8I:
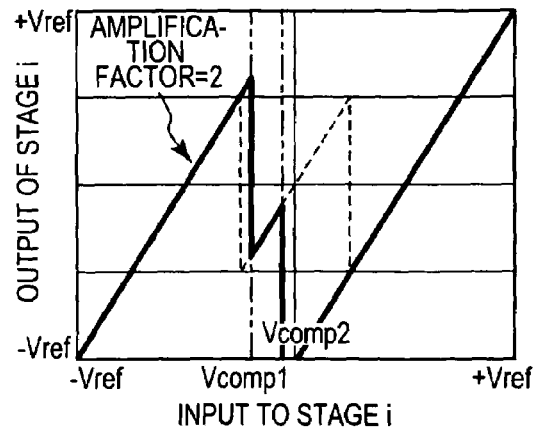
Figure 8J:
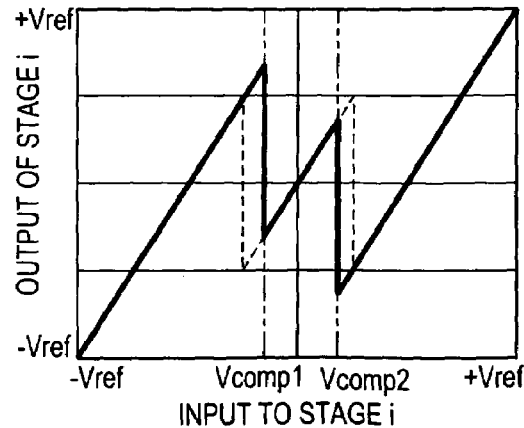

FIG. 8J shows the case where both of a threshold value (Vcomp1) of a comparator circuit (reference numeral 13.1 in FIG. 3) with high reference potential and a threshold value (Vcomp2) of a comparator circuit (reference numeral 13.2 in FIG. 3) with low reference potential exceed a tolerable range. Thus in the case where the two comparators both malfunction, output logic of the analog-digital conversion circuit inside each stage is devised and, thereby, consequently it becomes apparent in which range the level of a signal to be determined falls. Therefore, by devising and the like output logic of the analog-digital circuit inside each stage, selection of comparators will no longer have to be changed. With a yield factor of a comparator being not more than 2σ, probability of combination in FIG. 8J is rare with not more than around 0.052% at the maximum.

When combinations of FIGS. 7B, 7C, 7D and FIG. 8E are present, selection of the comparator is changed once or more.

Figure 7B:
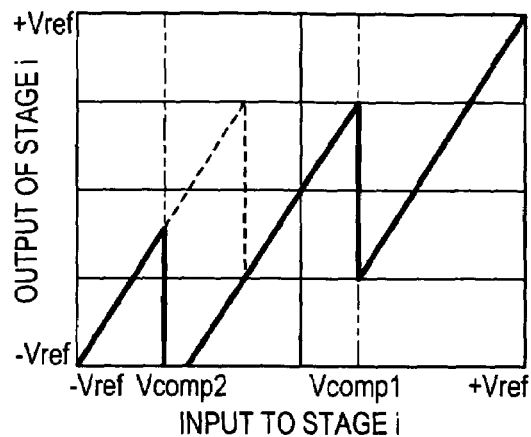

FIG. 7B shows the case where a threshold value (Vcomp1) of a comparator circuit (reference numeral 13.1 in FIG. 3) with high reference potential falls within a tolerable range and a threshold value (Vcomp2) of a comparator circuit (reference numeral 13.2 in FIG. 3) with low reference potential exceeds the negative tolerance.

Figure 7C:
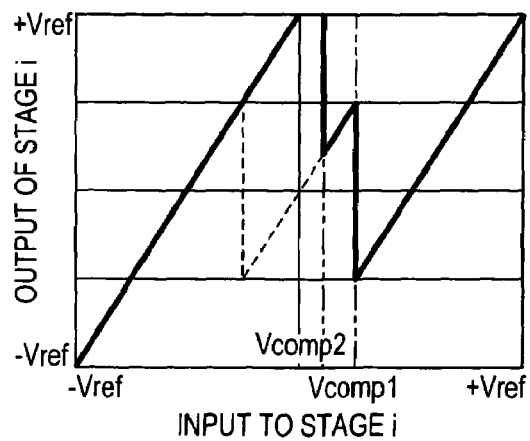

FIG. 7C shows the case where a threshold value (Vcomp1) of a comparator circuit (reference numeral 13.1 in FIG. 3) with high reference potential falls within a tolerable range and a threshold value (Vcomp2) of a comparator circuit (reference numeral 13.2 in FIG. 3) with low reference potential exceeds the positive tolerance.

Figure 7D:
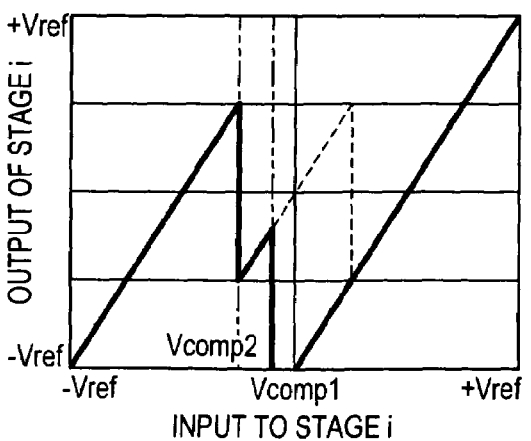

FIG. 7D shows the case where a threshold value (Vcomp1) of a comparator circuit (reference numeral 13.1 in FIG. 3) with high reference potential exceeds a negative tolerance and a threshold value (Vcomp2) of a comparator circuit (reference numeral 13.2 in FIG. 3) with low reference potential falls within the tolerable range.

FIG. 8E shows the case where a threshold value (Vcomp1) of a comparator circuit (reference numeral 13.1 in FIG. 3) with high reference potential exceeds a positive tolerance and a threshold value (Vcomp2) of a comparator circuit (reference numeral 13.2 in FIG. 3) with low reference potential falls within the tolerable range.

When combinations of FIGS. 8F and 8G are present, selection of the comparator is changed twice or more.

FIG. 8F shows the case where a threshold value (Vcomp1) of a comparator circuit (reference numeral 13.1 in FIG. 3) with high reference potential exceeds the negative tolerance and a threshold value (Vcomp2) of a comparator circuit (reference numeral 13.2 in FIG. 3) with low reference potential exceeds the negative tolerance.

FIG. 8G shows the case where a threshold value (Vcomp1) of a comparator circuit (reference numeral 13.1 in FIG. 3) with high reference potential exceeds the positive tolerance and a threshold value (Vcomp2) of a comparator circuit (reference numeral 13.2 in FIG. 3) with low reference potential exceeds the positive tolerance.

In the case of combinations of FIGS. 8H and 8I, a method of detecting a comparator exceeding an offset value is the same as in the case of FIGS. 8C and 8D respectively and, therefore, selection of the comparator is changed once or more.

FIG. 8H shows the case where a threshold value (Vcomp1) of a comparator circuit (reference numeral 13.1 in FIG. 3) with high reference potential falls within a tolerable range and a threshold value (Vcomp2) of a comparator circuit (reference numeral 13.2 in FIG. 3) with low reference potential exceeds the positive tolerance and the case where the determination point of the comparator is reversed (Vcomp2<Vcomp1).

FIG. 8I shows the case where a threshold value (Vcomp1) of a comparator circuit (reference numeral 13.1 in FIG. 3)

with high reference potential exceeds the negative tolerance and a threshold value (Vcomp2) of a comparator circuit (reference numeral 13.2 in FIG. 3) with low reference potential falls within a tolerable range and the case where the determination point of the comparator is reversed (Vcomp1<Vcomp2).

In combinations of FIGS. 8H, 8I and 8J, even in the case where the determination point of a comparator is reversed, the output signal of the coder (reference numeral 15 in FIG. 3) is required to give rise to the same result as in the case where the determination point of the comparator is not reversed, the circuit configuration is changed.

Here, when the offset values of all auxiliary comparators are not lower than tolerance in the comparator circuit (reference numeral 13.1 in FIG. 3) with high reference potential and the comparator circuit (reference numeral 13.2 in FIG. 3) with low reference potential, the performance of the A/D converter is not guaranteed.

In the present embodiment, a training period (testing period) for selecting a comparator is provided and the training period is controlled by a signal input from the exterior.

Figures 11A, 11B:
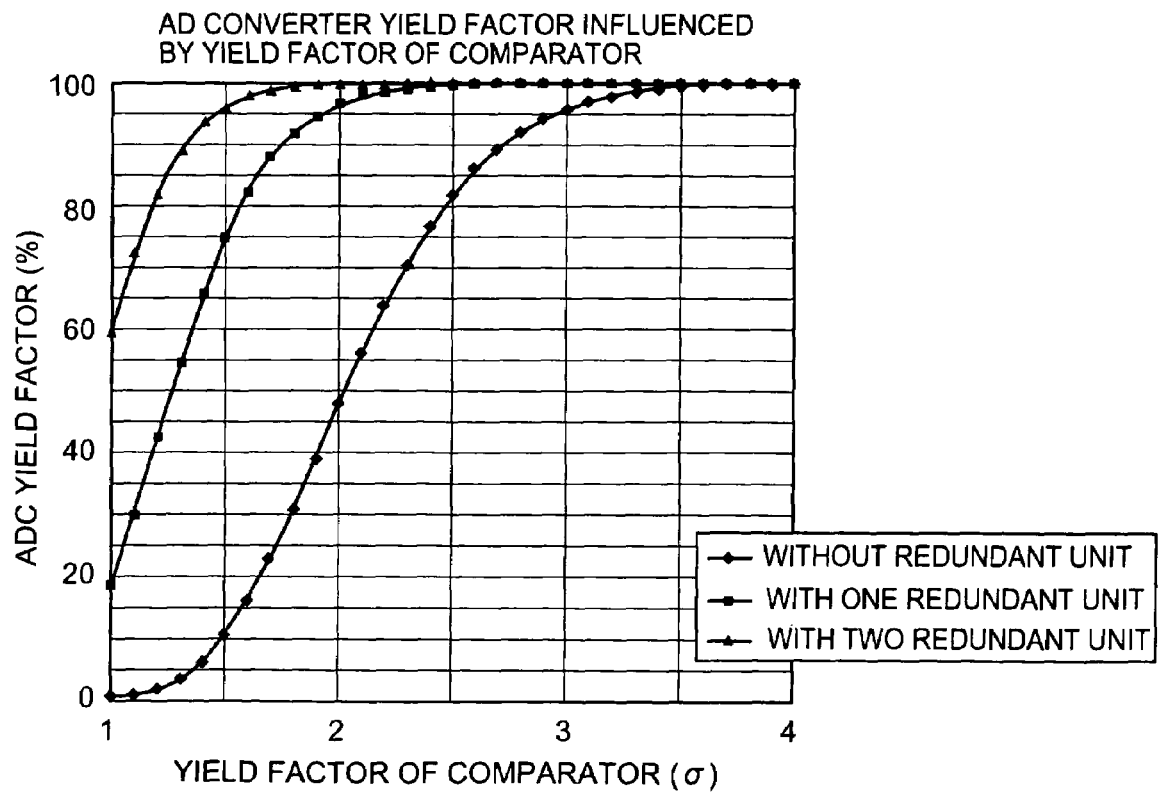
FIGS. 11A and 11B are diagrams illustrating relation of yield factors of an A/D converter influenced by the yield factor of a comparator in an embodiment of the present invention.
Figure 12:
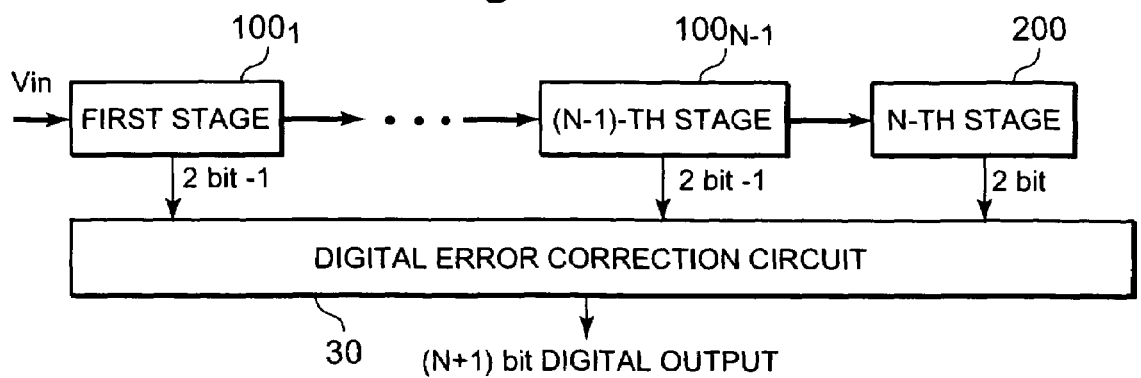
FIG. 12 is a diagram illustrating an example of an entire configuration of a conventional pipeline type A/D converter.

FIG. 11A lists, in a table form, the yield factors of a pipeline type A/D converter influenced by the yield factor of a comparator in 10-bit pipeline type A/D converter of 1.5-bit resolution stage. FIG. 11B is a graph plotting yield factors of a comparator and yield factors of a pipeline type A/D converter without a redundant unit (plotted by a black circle), with one redundant unit (plotted by a black quadrangle) and with two redundant units (plotted by a black triangle). When the yield factor of a comparator is 98.8%, the yield factor of an A/D converter not in redundant configuration will be not larger than 81.9% and the yield factor of an A/D converter in redundant configuration with a comparator in redundant configuration with a set of two units, that is, individually provided with one auxiliary comparator will be not larger than 99.7%.

According to the present embodiment, the comparator is in redundant configuration and thereby circuit designing of a comparator circuit is simplified. In order to make the yield factor of a pipeline type A/D converter be not less than 99.0%, the yield factor of comparator not in redundant configuration is required to be not less than 99.95% (=3.5σ or larger).

In contrast, according to the present invention, in order to make the yield factor of the pipeline type A/D converter to which one comparator being redundant is added to each comparator be not less than 99.0%, the yield factor of each comparator can be alleviated to not less than 97.9% (=2.3σ or larger).

According to the present embodiment, dispersion in the offset value of a comparator is alleviated. Thereby an element size advantageous for increasing speed and decrease in area of circuits of a comparator can become selectable to contribute to an increase in yield factor of products of semiconductor integrated circuit apparatus on which a pipeline type A/D converter is mounted.

With A [mV] being the tolerable offset value of the comparator and B [mV] being dispersion width (σ value) of the offset value of a comparator, the yield factor of a comparator becoming not larger than a tolerable offset value is expressed by the following expression (1):

$$(A/B)\sigma \quad (1)$$

With $x=(A/B)\sigma$, only the yield factor of the comparator influences the yield factor of the pipeline type A/D converter, thus the yield factor of the pipeline type A/D converter is derived by the following expression (2):

$$x^N \quad (2)$$

(wherein N being a total number of comparators influencing the yield factor of the pipeline type A/D converter).

When a comparator for a determination point is in redundant configuration with C units each, the yield factor (%) of each comparator is expressed by the following expression (3):

$$\{1-(1-x)^C\} \times 100 \quad (3)$$

(here, $x=(A/B)\sigma$).

Accordingly, the yield factor (%) of the pipeline type A/D converter is:

$$\{1-(1-x)^C\}^N \times 100 \quad (4)$$

(here, $x=(A/B)\sigma$).

Next, as another embodiment, a technique for detecting a comparator with an offset exceeding a tolerance will be described below in a pipeline type A/D converter for a first stage to an (N−1)-th stage including a stage outputting a code different from 1.5 bit data (1.5 resolution). A method of detecting a comparator having caused an error in the case where an arbitrary stage in or previous to second stage from the N-th stage in an N-stage pipeline type A/D converter illustrated in FIG. 1 is converted to a digital value with 6 comparators will be described blow. Here, in general, that stage is called a stage with "2.5 bit resolution" (or "2.8 bit resolution").

Figure 13:
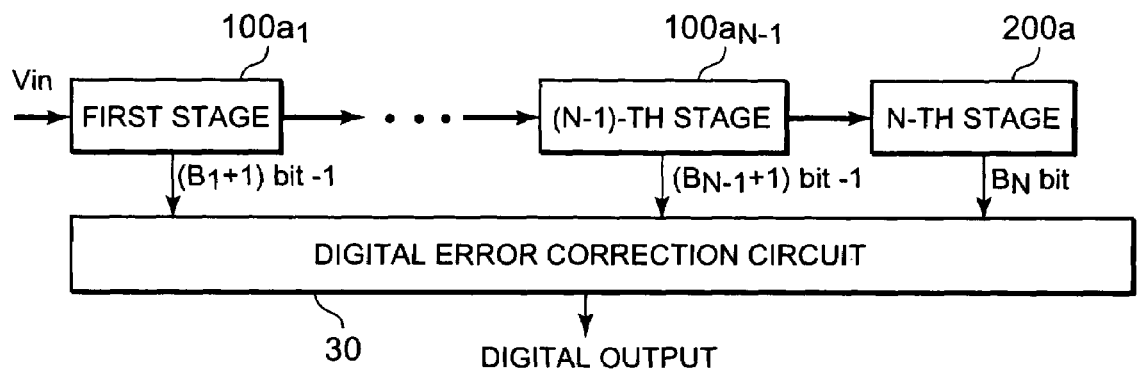
FIG. 13 is a diagram illustrating a reference example of an entire configuration of a pipeline type A/D converter.
Figure 14:
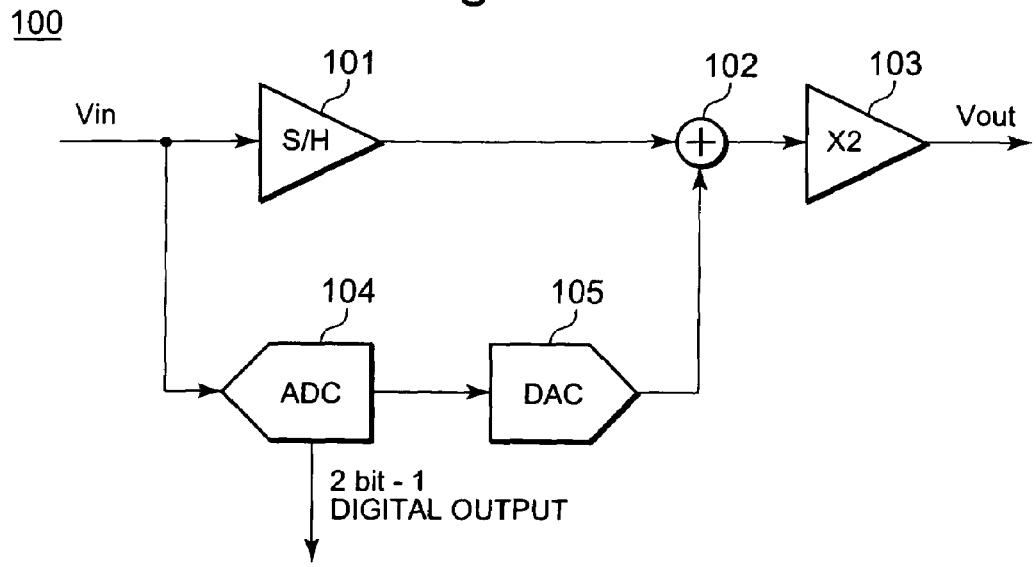
FIG. 14 is a diagram illustrating an example of the configuration of the first stage to the N-th stage in FIG. 12.
Figure 15:
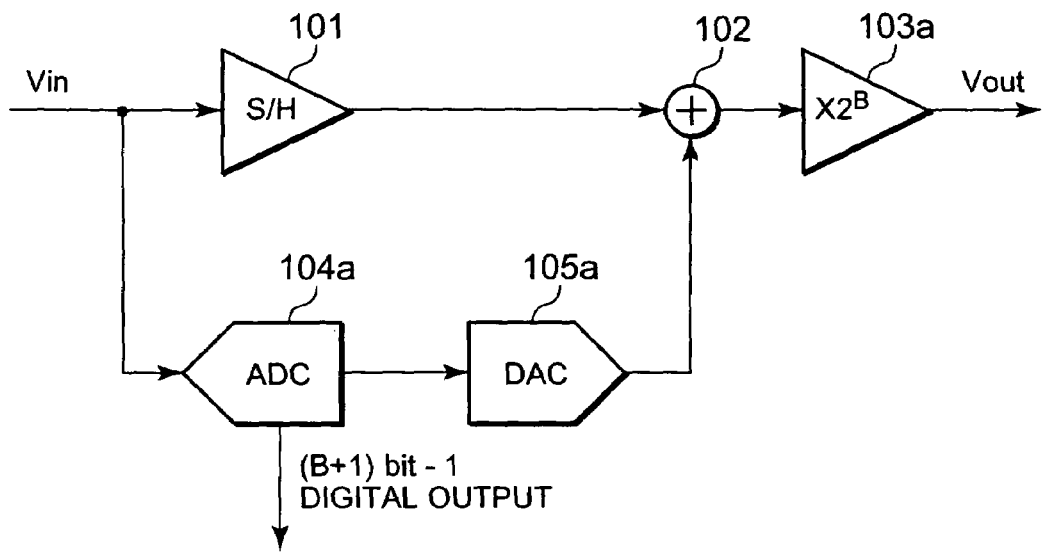
FIG. 15 is a diagram illustrating an example of the configuration of the first stage to the N-th stage in FIG. 13.
Figure 16:
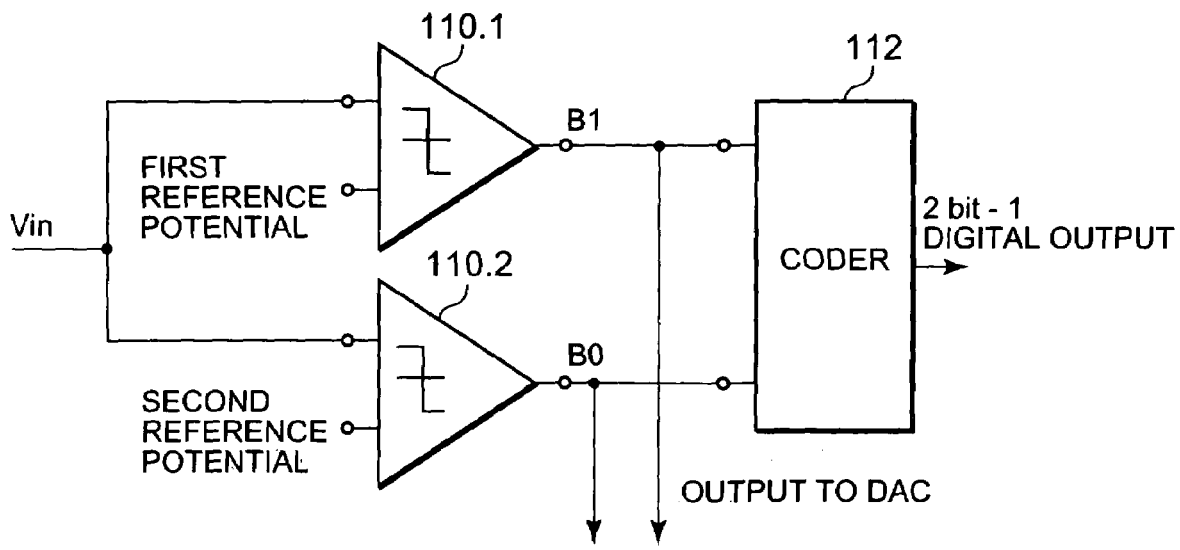
FIG. 16 is a diagram illustrating an example of the configuration of an ADC circuit of the first stage to the N-th stage in FIG. 12.
Figure 19:
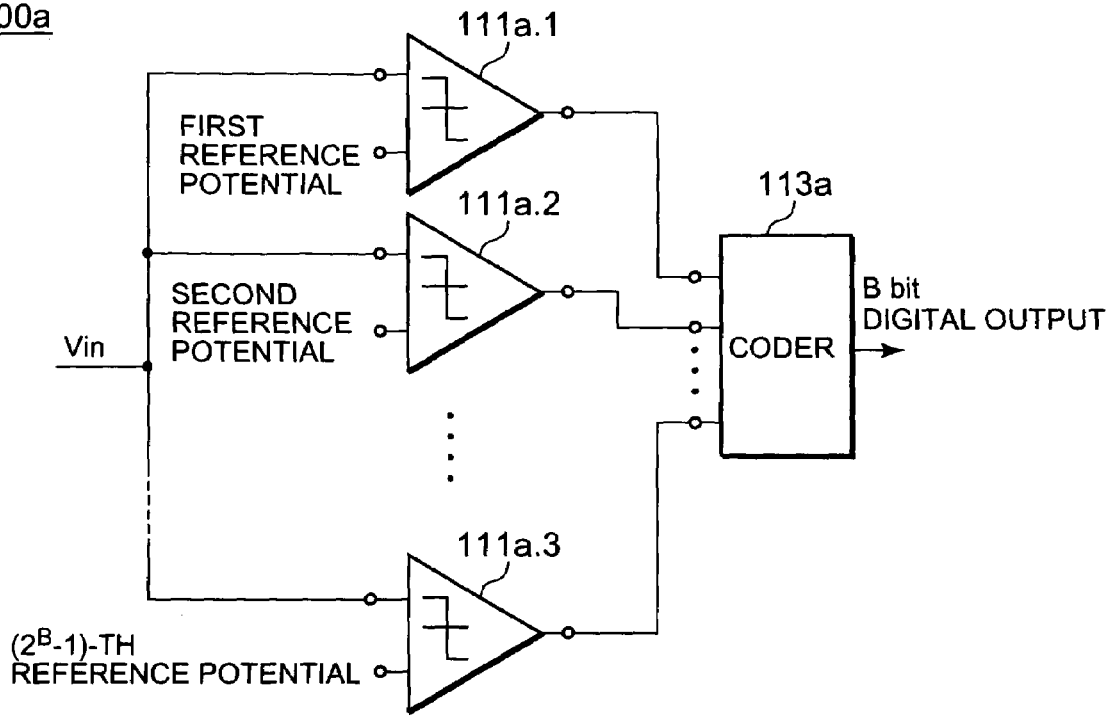
FIG. 19 is a diagram illustrating an example of the configuration of the (N−1)-th stage in FIG. 13.

In a pipeline type A/D converter with 2.5 bit resolution, $B_1$ to $B_{N-1}$ of the first stage to the (N−1)-th stage in FIG. 13 is 2 and $B_N$ of the N-th stage is 3. In the present embodiment, a configuration in FIG. 13 comprises a comparator selection circuit 40 in FIG. 1. The configuration of the first stage ($100a_1$) to the (N−1)-th stage ($100a_{N-1}$) is the same, that is, a configuration illustrated in FIG. 15, for example. An ADC circuit 104a in FIG. 15 comprises 6 comparators comparing an analog signal with a reference potential in parallel. Each of the 6 comparators is in redundant configuration. The comparator in redundant configuration receives an input of comparator selection signal from a comparator selection circuit so that one comparator is selected. That is, each of a comparator 110a.1 to a comparator 110a.3 is in redundant configuration illustrated in FIG. 4 (here, B=2 in FIG. 17). In addition, the N-th stage (200a) is in configuration illustrated in FIG. 19 (here, B=3 in FIG. 19). The ADC circuit comprises 7 comparators comparing an analog signal with a reference potential in parallel to output data of 3 bit data.

Figure 17:
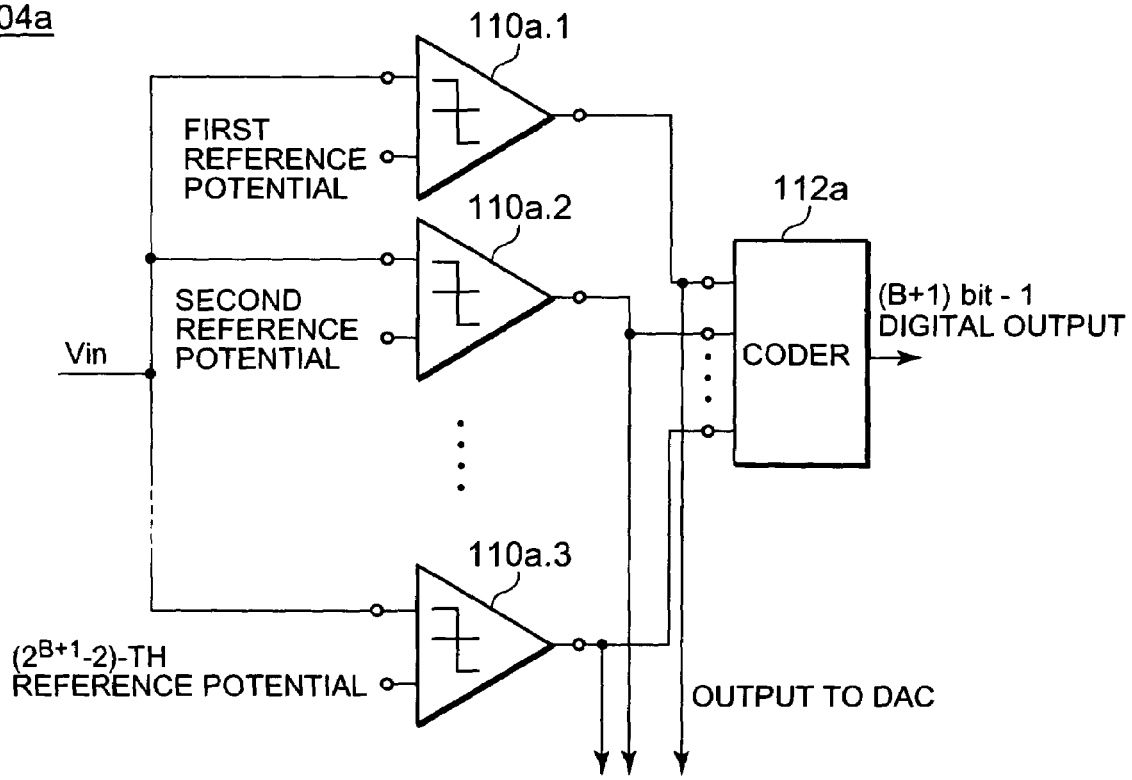
FIG. 17 is a diagram illustrating an example of the configuration of an ADC circuit of the (N−1)-th stage in FIG. 13.
Figure 18:
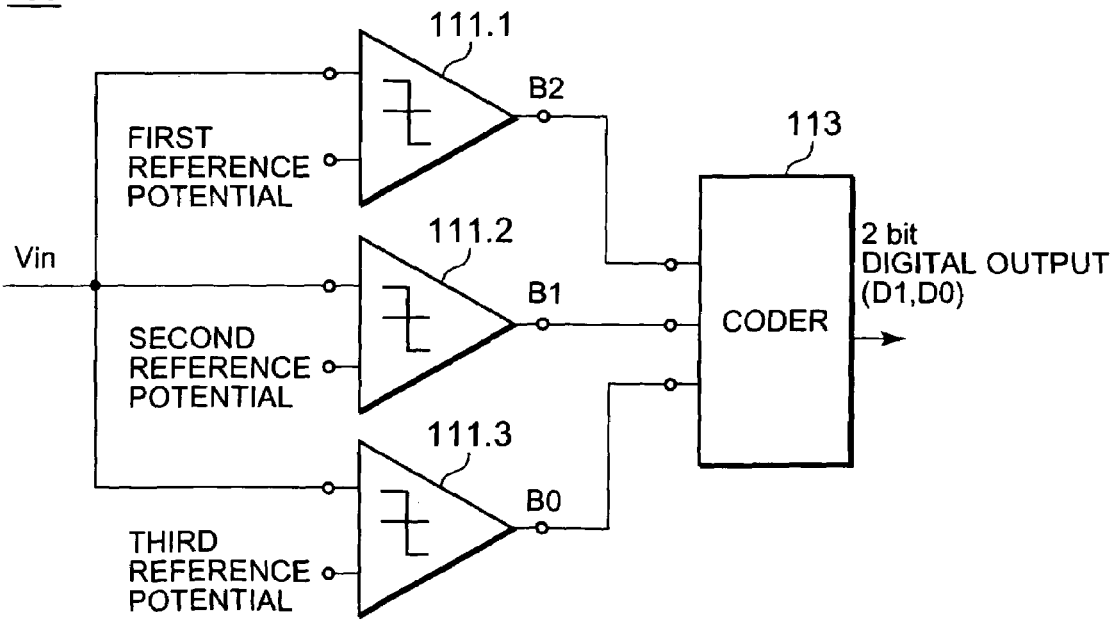
FIG. 18 is a diagram illustrating an example of the configuration of the N-th stage in FIG. 12.

With reference to FIG. 17, in the present embodiment, the ADC circuit 104a in the first stage to the (N−1)-th stage is provided with 6 comparators corresponding with reference potential of first to sixth (=$2^{(2+1)}-2$) levels. Each comparator is in redundant configuration. The stage with 2.5 bit resolution comprises 6 comparators, consisting of, in order from the side detecting a low voltage, a first comparator with lowest potential in that stage;
a second comparator with second lowest potential in that stage;
a third comparator with third lowest potential in that stage;
a fourth comparator with third highest potential in that stage;
a fifth comparator with second highest potential in that stage; and
a sixth comparator with the highest potential in that stage.

(1) At the time when a digital output (D2, D1, D0) of a stage among the first stage to the (N−1)-th stage with 2.5 bit resolution is (0, 0, 0); the digital outputs of all the stages after the relevant stage are the largest digital value output by each stage; and the POVR signal from the N-th stage is in an activated state, selection of the first comparator with the lowest potential of the relevant stage is changed. The first comparator with the lowest potential of the relevant stage is replaced by a redundant comparator prepared in advance.

(2) At the time when a digital output (D2, D1, D0) of a stage among the first stage to the (N−1)-th stage with 2.5 bit resolution is (0, 0, 1); the digital outputs of all the stages after the relevant stage are the largest digital value output by each stage; and the POVR signal from the N-th stage is in an activated state, selection of the second comparator with the second lowest potential of the relevant stage is changed.

(3) At the time when a digital output (D2, D1, D0) of a stage among the first stage to the (N−1)-th stage with 2.5 bit resolution is (0, 1, 0); the digital outputs of all the stages after the relevant stage are the largest digital value output by each stage; and the POVR signal from the N-th stage is in an activated state, selection of the third comparator with the third lowest potential of the relevant stage is changed.

(4) At the time when a digital output (D2, D1, D0) of a stage among the first stage to the (N−1)-th stage with 2.5 bit resolution is (0, 1, 1); the digital outputs of all the stages after the relevant stage are the largest digital value output by each stage; and the POVR signal from the N-th stage is in an activated state, selection of the fourth comparator with the third highest potential of the relevant stage is changed.

(5) At the time when a digital output (D2, D1, D0) of a stage among the first stage to the (N−1)-th stage with 2.5 bit resolution is (1, 0, 0); the digital outputs of all the stages after the relevant stage are the largest digital value output by each stage; and the POVR signal from the N-th stage is in an activated state, selection of the fifth comparator with the second highest potential of the relevant stage is changed.

(6) At the time when a digital output (D2, D1, D0) of a stage among the first stage to the (N−1)-th stage with 2.5 bit resolution is (1, 0, 1); the digital outputs of all the stages after the relevant stage are the largest digital value output by each stage; and the POVR signal from the N-th stage is in an activated state, selection of the sixth comparator with the highest potential of the relevant stage is changed.

(7) At the time when a digital output (D2, D1, D0) of a stage among the first stage to the (N−1)-th stage with 2.5 bit resolution is (0, 0, 1); the digital outputs of all the stages after the relevant stage are the smallest digital value output by each stage; and the MOVR signal from the N-th stage is in an activated state, selection of the first comparator with the lowest potential of the relevant stage is changed.

(8) At the time when a digital output (D2, D1, D0) of a stage among the first stage to the (N−1)-th stage with 2.5 bit resolution is (0, 1, 0); the digital outputs of all the stages after the relevant stage are the smallest digital value output by each stage; and the MOVR signal from the N-th stage is in an activated state, selection of the second comparator with the second lowest potential of the relevant stage is changed.

(9) At the time when a digital output (D2, D1, D0) of a stage among the first stage to the (N−1)-th stage with 2.5 bit resolution is (0, 1, 1); the digital outputs of all the stages after the relevant stage are the smallest digital value output by each stage; and the MOVR signal from the N-th stage is in an activated state, selection of the third comparator with the third lowest potential of the relevant stage is changed.

(10) At the time when a digital output (D2, D1, D0) of a stage among the first stage to the (N−1)-th stage with 2.5 bit resolution is (1, 0, 0); the digital outputs of all the stages after the relevant stage are the smallest digital value output by each stage; and the MOVR signal from the N-th stage is in an activated state, selection of the fourth comparator with the third highest potential of the relevant stage is changed.

(11) At the time when a digital output (D2, D1, D0) of a stage among the first stage to the (N−1)-th stage with 2.5 bit resolution is (1, 0, 1); the digital outputs of all the stages after the relevant stage are the smallest digital value output by each stage; and the MOVR signal from the N-th stage is in an activated state, selection of the fifth comparator with the second highest potential of the relevant stage is changed.

(12) At the time when a digital output (D2, D1, D0) of a stage among the first stage to the (N−1)-th stage with 2.5 bit resolution is (1, 1, 0); the digital outputs of all the stages after the relevant stage are the smallest digital value output by each stage; and the MOVR signal from the N-th stage is in an activated state, selection of the sixth comparator with the highest potential of the relevant stage is changed.

In addition, according to a similar detection method as described above, offset errors of a comparator in redundant configuration of the stage with 3.5 bit resolution can be detected based on the bit code of the first stage to the Nth stage and the control signals POVR and MOVR. In a pipeline type A/D converter with 3.5 bit resolution, $B_1$ to $B_{N-1}$ of the first stage to the (N−1)-th stage in FIG. 13 is 3 and $B_N$ of the N-th stage is 4 and the configuration of the first stage ($100a_1$) to the (N−1)-th stage ($100a_{N-1}$) is the same. For example, an ADC circuit comprises 14 comparators comparing an analog signal with a reference potential in parallel (B=4 in FIG. 17). Each of the 14 comparators is in redundant configuration. Each comparator receives an input of comparator selection signal from a comparator selection circuit (reference numeral 40 in FIG. 1) so that one comparator is selected. The ADC circuit of the N-th stage (200a) comprises 15 comparators (B=4 in FIG. 19) comparing an analog signal with a reference potential in parallel to output data of 4 bit data.

The present invention has been described based on the above examples, but the present invention is not limited only to the above examples, and includes various kinds of alterations and modifications that could be achieved by a person skilled in the art within the scope of the invention of each of claims of this application as a matter of course.

Further, it is noted that, Applicant's intent is to encompass equivalents of all claim elements, even if amended later during prosecution

What is claimed is:

1. A pipeline type analog-digital converter comprising:
   a first to an N-th (N is an integer of not less than 2) stages brought into cascade connection and respectively converting an analog signal input from a preceding stage to a digital signal having a predetermined bit and outputting the digital signal,
   each of the first to the (N−1)-th stages comprising an analog-digital converter circuit including a first to an M-th (M being an integer of not less than 2) comparators comparing an analog signal with a first to an M-th reference potential being determined in advance and mutually different in parallel, and
   at least one stage of the first to the (N−1)-th stages comprising an auxiliary comparator; and
   a comparator selection circuit outputting a comparator selection signal to selectively activate one of the comparators, wherein:
   when a comparator of said first to M-th comparators is determined to be a comparator with an offset exceeding a tolerance, the comparator with the offset exceeding the tolerance is replaced by said auxiliary comparator, based on the comparator selection signal.

2. The pipeline type analog-digital converter according to claim 1, wherein:
   each of the first to the (N−1)-th stages is in redundant configuration comprising one or a plurality of auxiliary comparators, and the comparator selection circuit outputs the comparator selection signal selectively activating one of the auxiliary comparators.

3. The pipeline type analog-digital converter according to claim 2, wherein:
in the case where, in any stage from the first to the (N−1)-th stage, an offset of the comparator of the stage is determined to exceed a tolerance, the comparator with the offset exceeding the tolerance is replaced by the auxiliary comparator, based on the comparator selection signal.

4. The pipeline type analog-digital converter according to claim 2, further comprising:
a digital error correction circuit which receives a bit data having undergone analog-digital conversion respectively in the first to the N-th stages, and carrying out a digital error correction processing to output a digital signal,
wherein the comparator selection circuit outputs the comparator selection signal in order to switch the comparator corresponding to the stage to another comparator in a case of detecting that combination of bit data supplied from the first to the N-th stages to the digital error correction circuit corresponds with a predetermined pattern with an offset of the comparator of any stage of the first to the (N−1)-th stages exceeding a tolerance.

5. The pipeline type analog-digital converter according to claim 1,
wherein each stage of the first to the (N−1)-th stages comprises:
a sample-and-hold circuit which receives an input of an analog signal from a preceding stage;
an analog-digital converter circuit which receives the analog signal to convert the analog signal to a digital signal;
a digital-analog converter circuit which receives a digital signal output from the analog-digital converter circuit to convert the digital signal to an analog signal;
a subtraction circuit which outputs a balance voltage between the output analog signal of the sample-and-hold circuit and the output analog signal of the digital-analog converter circuit; and
an amplifier circuit which amplifies an output signal of the subtraction circuit at a predetermined amplification factor,
wherein the analog-digital converter circuit comprises a flash type analog-digital converter circuit comparing input analog signals in parallel with a plurality of comparators and each of a plurality of the comparators is in a redundant configuration.

6. The pipeline type analog-digital converter according to claim 5,
wherein the N-th stage comprises:
an analog-digital converter circuit which receives an input of an analog signal output from the (N−1)-th stage and outputting a digital signal, the analog-digital converter circuit comprising a first to an L-th (here, L is an integer of not less than 2) comparators comparing analog signal voltages in parallel at a first to an L-th reference potentials being applied respectively;
a first comparator which compares a potential close to a potential of an upper limit in a range of the analog signal voltage with the analog signal voltage and which outputs whether the analog signal voltage is larger than the upper limit;
a second comparator which compares a potential close to a potential of a lower limit in a range of the analog signal voltage with the analog signal voltage and which outputs whether the analog signal voltage is larger than the lower limit; and
a coder which codes outputs of the first to the L-th comparators and outputs a digital signal having a predetermined bit.

7. A pipeline type analog-digital converter, comprising:
a first to an N-th (N is an integer of not less than 2) stages brought into cascade connection and which convert an analog signal being respectively input to a digital signal of a predetermined bit and output the digital signal;
wherein each of the first to the (N−1)-th stages comprises:
a circuit sample-and-holding an analog signal from a preceding stage;
an analog-digital converter circuit which includes a first to an M-th (M being an integer of not less than 2) comparators receiving a sample-and-held analog signal and comparing the analog signal with a first to an M-th reference potential being determined in advance in parallel,
a digital-analog converter circuit which receives a digital signal output from the analog-digital converter circuit to convert the digital signal to an analog signal;
a subtraction circuit which outputs a balance voltage between the sample-and-held analog signal and the analog signal from the digital-analog converter circuit; and
an amplifier circuit which amplifies an output of the subtraction circuit at a predetermined amplification factor,
wherein at least one of the first to the (N−1)-th stages is in redundant configuration comprising at least one auxiliary comparator on each of the first to the M-th comparators; and
wherein at least one of the first to the (N−1)-th stages comprises a comparator selection circuit which outputs a comparator selection signal selectively activating one of the comparators in the redundant configuration; and
wherein, when a comparator of said first to M-th comparators is determined to be a comparator with an offset exceeding a tolerance, the comparator with the offset exceeding the tolerance is replaced by said auxiliary comparator, based on the comparator selection signal.

8. The pipeline type analog-digital converter according to claim 7, wherein:
each of the first to the (N−1)-th stages is in redundant configuration comprising one or a plurality of auxiliary comparators, and the comparator selection circuit outputs the comparator selection signal selectively activating one of the auxiliary comparators.

9. The pipeline type analog-digital converter according to claim 7,
wherein the N-th stage comprises:
an analog-digital converter circuit receiving an input of an analog signal output from the (N−1)-th stage and outputting a digital signal, the analog-digital converter circuit comprising a first to an L-th (here, L is an integer of not less than 2) comparators comparing analog signal voltages in parallel at a first to an L-th reference potentials being applied respectively;
a first comparator comparing a potential close to a potential of an upper limit in a range of the analog signal voltage with the analog signal voltage and outputting whether or not the analog signal voltage is larger than the upper limit;
a second comparator comparing a potential close to a potential of a lower limit in a range of the analog signal voltage with the analog signal voltage and outputting whether the analog signal voltage is larger than the lower limit; and a coder coding outputs of the first to the L-th comparators and outputting a digital signal having a predetermined bit.

10. A pipeline type analog-digital converter, comprising:
a plurality of stages connected in series, each of said stages receiving an analog signal output from a preceding stage, at least a first one of said stages including an analog-to-digital converter, said analog-to-digital converter including comparators including first and second comparing circuits comparing the analog signal with first and second reference potential signals, said comparators including first and second redundant comparing circuits as substitutes of said first and second comparing circuits, and
a comparator selection circuit which outputs a comparator selection signal which selects one of said first comparing circuit and said first redundant comparing circuit, and selects one of said second comparing circuit and said second redundant comparing circuit.

11. The pipeline type analog-digital converter, as claimed in claim 10,
wherein a final stage of said stages includes a third comparing circuit which compares the analog signal with a reference potential signal higher than said second potential signal to output a first control signal, and a fourth circuit which compares the analog signal with a reference potential signal lower than said first potential signal to output a second control signal; and
wherein intermediate stages between said first and final stages comprise said comparator including said first comparing circuit, said first redundant comparing circuit, said second comparing circuit and said second redundant comparing circuit.

12. The pipeline type analog-digital converter, as claimed in claim 11, wherein, when the analog signal which the first stage receives is lower than said first reference potential signal, the analog signal which the intermediate stages receive is higher than said second potential signal, said third comparing circuit of said final stage outputs said first control signal, said first comparing circuit of said first stage is replaced with said first redundant comparing circuit of said first stage.

13. The pipeline type analog-digital converter, as claimed in claim 11, wherein, when the analog signal which the first stage receives is higher than said first reference potential signal and lower than said second reference potential signal, the analog signal which the intermediate stages receive is higher than said second potential signal, said third comparing circuit of said final stage outputs said first control signal, said second comparing circuit of said first stage is replaced with said second redundant comparing circuit of said first stage.

14. The pipeline type analog-digital converter, as claimed in claim 11, wherein, when the analog signal which the first stage receives is higher than said first reference potential signal and lower than said second reference potential signal, the analog signal which the intermediate stages receive is lower than said first potential signal, said fourth comparing circuit of said final stage outputs said second control signal, and said first comparing circuit of said first stage is replaced with said first redundant comparing circuit of said first stage.

15. The pipeline type analog-digital converter, as claimed in claim 11, wherein, when the analog signal which the first stage receives is higher than said second reference potential signal, the analog signal which the intermediate stages receive is lower than said first potential signal, said fourth comparing circuit of said final stage outputs said second control signal, and said second comparing circuit of said first stage is replaced with said second redundant comparing circuit of said first stage.

* * * * *